United States Patent
Fujiwara et al.

(10) Patent No.: US 10,510,739 B2
(45) Date of Patent: Dec. 17, 2019

(54) METHOD OF PROVIDING LAYOUT DESIGN OF SRAM CELL

(71) Applicant: TAIWAN SEMICONDUCTOR MANUFACTURING COMPANY LTD., Hsinchu (TW)

(72) Inventors: Hidehiro Fujiwara, Hsin-Chu (TW); Tetsu Ohtou, Hsinchu (TW); Chih-Yu Lin, Taichung (TW); Hsien-Yu Pan, Hsinchu (TW); Yasutoshi Okuno, Hsinchu (TW); Yen-Huei Chen, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 54 days.

(21) Appl. No.: 15/726,334

(22) Filed: Oct. 5, 2017

(65) Prior Publication Data
US 2018/0166433 A1    Jun. 14, 2018

Related U.S. Application Data

(60) Provisional application No. 62/431,874, filed on Dec. 9, 2016.

(51) Int. Cl.
*H01L 27/02* (2006.01)
*H01L 21/8238* (2006.01)
*H01L 27/11* (2006.01)
*H01L 27/092* (2006.01)
*G06F 17/50* (2006.01)

(52) U.S. Cl.
CPC ...... *H01L 27/0207* (2013.01); *G06F 17/5081* (2013.01); *H01L 21/823871* (2013.01); *H01L 27/092* (2013.01); *H01L 27/1104* (2013.01)

(58) Field of Classification Search
None
See application file for complete search history.

(56) References Cited

U.S. PATENT DOCUMENTS

| | | | |
|---|---|---|---|
| 2015/0115395 A1* | 4/2015 | Chuang | G06F 17/5072 257/506 |
| 2016/0078922 A1* | 3/2016 | Liaw | H01L 29/66666 365/51 |

* cited by examiner

*Primary Examiner* — Bo B Jang
(74) *Attorney, Agent, or Firm* — WPAT, P.C., Intellectual Property Attorneys; Anthony King

(57) ABSTRACT

A method of providing a layout design of an SRAM cell includes: providing a substrate layout comprising a first oxide diffusion area, a second oxide diffusion area, a first polysilicon layout, and a second polysilicon layout, wherein the first polysilicon layout extends across the first oxide diffusion area and the second oxide diffusion area, and the second polysilicon layout extends across the first oxide diffusion area and the second oxide diffusion area; forming a first pull-up transistor on the first oxide diffusion area and the first polysilicon layout; forming a first pull-down transistor on the second oxide diffusion area and the first polysilicon layout; forming a second pull-up transistor on the first oxide diffusion area and the second polysilicon layout; and forming a second pull-down transistor on the second oxide diffusion area and second first polysilicon layout.

21 Claims, 18 Drawing Sheets

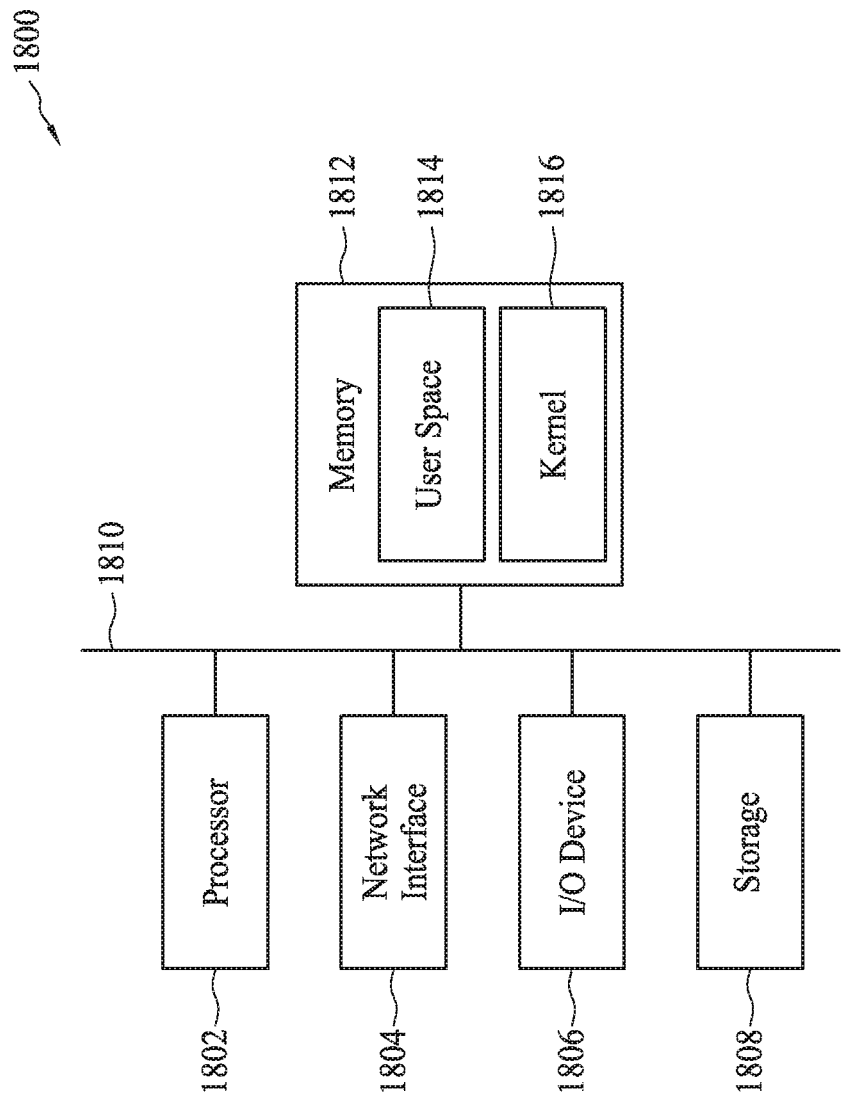

METHOD OF PROVIDING LAYOUT DESIGN OF SRAM CELL

CROSS-REFERENCE TO RELATED APPLICATION

This application claims the benefit of U.S. Provisional Application No. 62/431,874, filed Dec. 9, 2016.

BACKGROUND

The semiconductor integrated circuit (IC) industry has experienced exponential growth. Technological advances in IC materials and design have produced generations of ICs where each generation has smaller and more complex circuits than the previous generation. For example, an SRAM cell requires complex front-end-of-line (FEOL) and middle-end-of-line (MEOL) patterns in the layout. A large number of masks are required to form the complex FEOL and MEOL patterns on the SRAM cell during the fabrication. Therefore, the cost of masks to form the complex FEOL and MEOL patterns is increased in advanced semiconductor manufacturing process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 18 is a block diagram of a hardware system for implementing the method of providing a layout design of an SRAM cell of FIG. 17 and the design flow of FIG. 16 in accordance with some embodiments.

DETAILED DESCRIPTION

Figure 1:
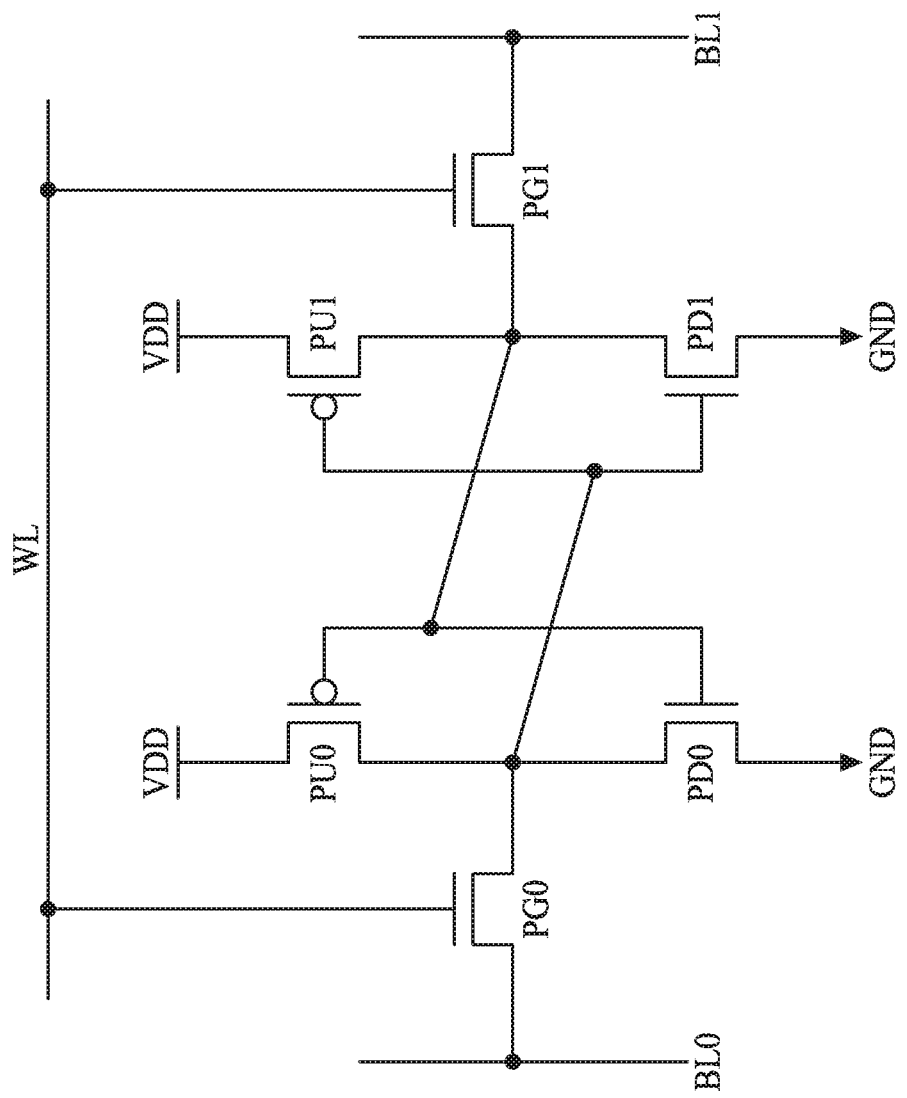
FIG. 1 is a circuit diagram illustrating a static random-access memory cell.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

Further, spatially relative terms, such as "beneath," "below," "lower," "above," "upper", "lower", "left", "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about"

means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 is a circuit diagram illustrating a static random-access memory (SRAM) cell 100. The SRAM cell 100 comprises six transistors PG0, PU0, PD0, PU1, PD1, PG1. The transistors PG0, PG1, PD0, and PD1 are N-type field-effect transistor, and the transistors PU0 and PU1 are P-type field-effect transistor. The transistors PG0 and PG1 are pass-gate transistor. The transistors PU0 and PD0 are configured to be an inverter coupled between the supply voltage and the ground voltage. The transistors PU1 and PD1 are configured to be another inverter coupled between the supply voltage and the ground voltage. The gates of the transistors PU0 and PD0 are connected to the drains of the transistors PU1 and PD1. The gates of the transistors PU1 and PD1 are connected to the drains of the transistors PU0 and PD0. A first connecting terminal of the transistor PG0 is connected to a first bit line BL0, and a second connecting terminal of the transistor PG0 is connected to the drains of the transistors PU0 and PD0. A first connecting terminal of the transistor PG0 is connected to a first bit line BL0, and a second connecting terminal of the transistor PG0 is connected to the drains of the transistors PU0 and PD0. A first connecting terminal of the transistor PG1 is connected to a second bit line BL1, and a second connecting terminal of the transistor PG1 is connected to the drains of the transistors PU1 and PD1. The gate terminals of the transistors PG0 and PG1 are connected to a word line WL. The operation of the SRAM cell 100 is omitted here for brevity.

Figure 2:
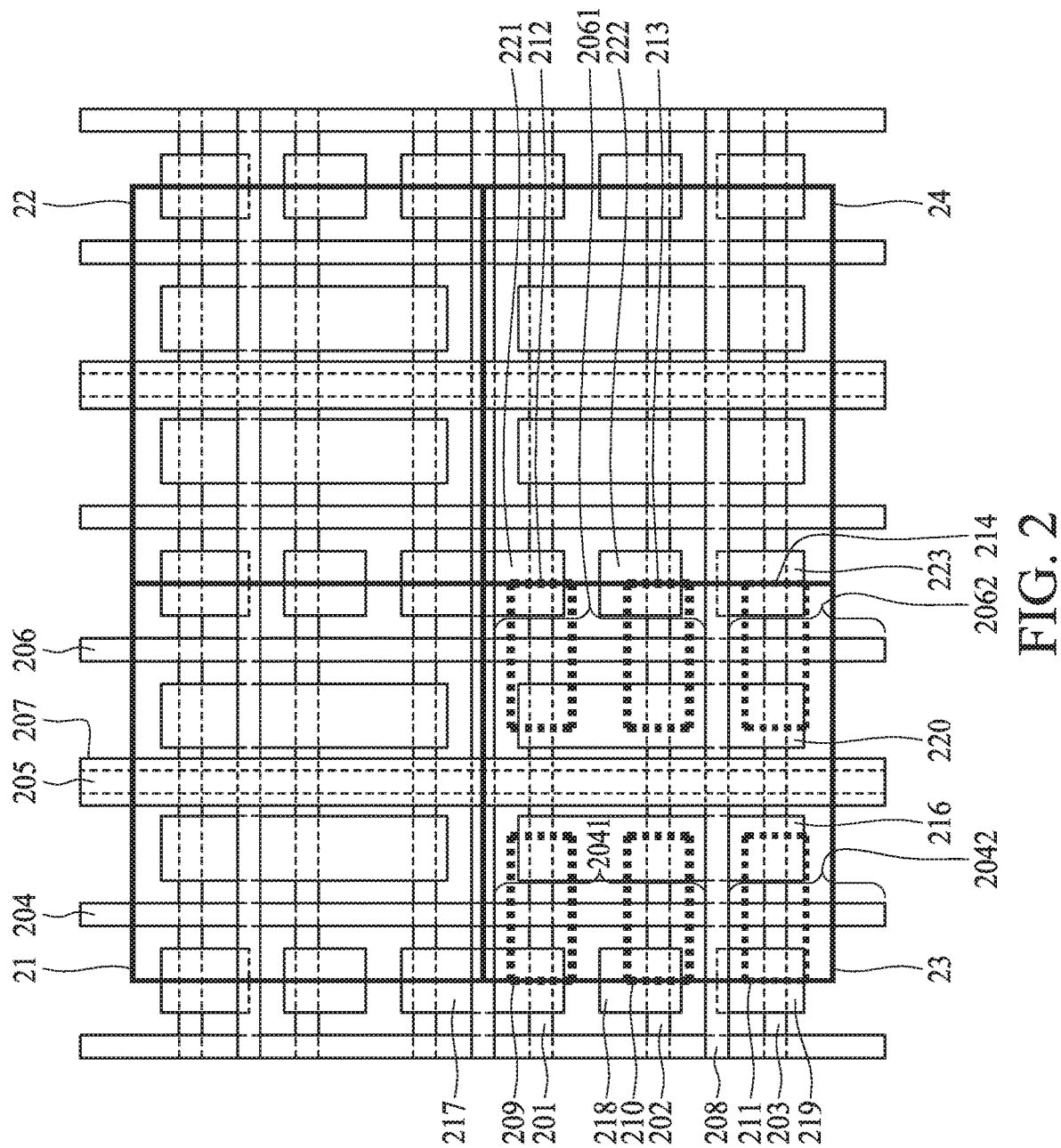
FIG. 2 is a diagram illustrating a layout design of an SRAM circuit in accordance with some embodiments.

FIG. 2 is a diagram illustrating a layout design 200 of an SRAM circuit in accordance with some embodiments. For brevity, FIG. 2 merely illustrates the layout design of oxide diffusion layer, polysilicon layer, and metal contact layer on a substrate layout of the SRAM circuit. In other words, FIG. 2 merely illustrates the front-end-of-line (FEOL) and the middle-end-of-line (MEOL) patterns of the SRAM circuit. In addition, four SRAM cells 21, 22, 23, and 24 are shown in FIG. 2. For brevity, the layout design of the SRAM cell 100 is located on the bottom-left side of FIG. 2, i.e. the layout design 23. The other three SRAM cells 21, 22, and 24 are configured to have the similar layout designs to the layout design 23, thus the detailed description is omitted here for brevity.

According to some embodiments, the substrate layout of the layout design 23 is configured to have a first oxide diffusion area 201, a second oxide diffusion area 202, a third oxide diffusion area 203, a first polysilicon layout 204, a second polysilicon layout 205, and a third polysilicon layout 206. The oxide diffusion areas 201, 202, and 203 are three parallel oxide diffusion areas. The polysilicon layouts 204, 205, and 206 are three parallel polysilicon layouts. The polysilicon layouts 204, 205, and 206 are arranged to extend perpendicularly across the oxide diffusion areas 201, 202, and 203. In other words, the oxide areas 201~203 extend in parallel with each other in a first direction. The poly layouts 204~206 extend in parallel with each other in a second direction, which is substantially orthogonal to the first direction.

A poly-remove layout 207 is disposed over the polysilicon layout 205. The poly-remove layout 207 overlaps with the polysilicon layout 205 in order to ignore or remove the polysilicon layout 205 during the fabrication of the SRAM circuit. In other words, when the polysilicon layout 205 is covered by the poly-remove layout 207, the semiconductor manufacturing process may not fabricate the polysilicon corresponding to the polysilicon layout 205 during the fabrication.

In addition, in the layout design 200, a first cut-poly layout 208 is disposed across the polysilicon layouts 204, 205, and 206. The cut-poly layout 208 is arranged to divide or cut the polysilicon layout 204 into a first polysilicon portion 2041 and a second polysilicon portion 2042, and to divide the polysilicon layout 206 into a third polysilicon portion 2061 and a fourth polysilicon portion 2062 during the fabrication of the SRAM circuit. The polysilicon portion 2041 extends across the oxide diffusion area 201 and the oxide diffusion area 202, the polysilicon portion 2042 extends across the oxide diffusion area 203, the polysilicon portion 2061 extends across the oxide diffusion area 201 and the oxide diffusion area 202, and the polysilicon portion 2062 extends across the oxide diffusion area 203.

A second cut-poly layout 2081 is disposed on the interface between the layout design 23 and the layout design 21. The cut-poly layout 2081 extends across the polysilicon layouts 204, 205, and 206 for dividing the polysilicon layouts 204, 205, and 206 in the layout design 23 from the layout design 21.

According to some embodiments, a first pull-up transistor 209 (e.g. PU0 in FIG. 1) is formed on an area around the intersection of the oxide diffusion area 201 and the polysilicon layout 204. A first pull-down transistor 210 (e.g. PD0 in FIG. 1) is formed on an area around the intersection of the oxide diffusion area 202 and the polysilicon layout 204. A first pass-gate transistor 211 (e.g. PG0 in FIG. 1) is formed on an area around the intersection of the oxide diffusion area 203 and the polysilicon layout 204. A second pull-up transistor 212 (e.g. PU1 in FIG. 1) is formed on an area around the intersection of the oxide diffusion area 201 and the polysilicon layout 206. A second pull-down transistor 213 (e.g. PD1 in FIG. 1) is formed on an area around the intersection of the oxide diffusion area 202 and the polysilicon layout 206. A second pass-gate transistor 214 (e.g. PG1 in FIG. 1) is formed on an area around the intersection of the oxide diffusion area 203 and the polysilicon layout 206.

Moreover, for the pull-up transistor 209, the pull-down transistor 210, and the pass-gate transistor 211, a contact layout 216 is disposed at a first side of the polysilicon layout 204. The contact layout 216 overlaps a first portion of the oxide diffusion area 201, a first portion of the oxide diffusion area 202, and a first portion of the oxide diffusion area 203. A contact layout 217 is disposed at a second side of the polysilicon layout 204. The contact layout 217 overlaps a second portion of the oxide diffusion area 201. A contact layout 218 is disposed at the second side of the polysilicon layout 204. The contact layout 218 overlaps a second portion of the oxide diffusion area 202. A contact layout 219 is disposed at the second side of the polysilicon layout 204. The contact layout 219 overlaps a second portion of the oxide diffusion area 203.

For the pull-up transistor 212, the pull-down transistor 213, and the pass-gate transistor 214, a contact layout 220 is disposed in a first side of the polysilicon layout 206. The contact layout 220 overlaps a third portion of the oxide diffusion area 201, a third portion of the oxide diffusion area 202, and a third portion of the oxide diffusion area 203. A contact layout 221 is disposed in a second side of the polysilicon layout 206. The contact layout 221 overlaps a fourth portion of the oxide diffusion area 201. A contact layout 222 is disposed in the second side of the polysilicon layout 206. The contact layout 222 overlaps a fourth portion of the oxide diffusion area 202. A contact layout 223 is disposed in the second side of the polysilicon layout 206. The contact layout 223 overlaps a fourth portion of the oxide diffusion area 203.

According to the layout design 23 of FIG. 2, the pull-up transistor 209, the pull-down transistor 210, and the pass-gate transistor 211 are aligned to the polysilicon layout 204. The pull-up transistor 212, the pull-down transistor 213, and the pass-gate transistor 214 are aligned to the polysilicon layout 216. Moreover, the transistors 209, 210, and 211 and the transistors 212, 213, and 214 are mirror-symmetric with respect to the poly-remove layout 207 or the polysilicon layout 205 respectively.

Figure 3:
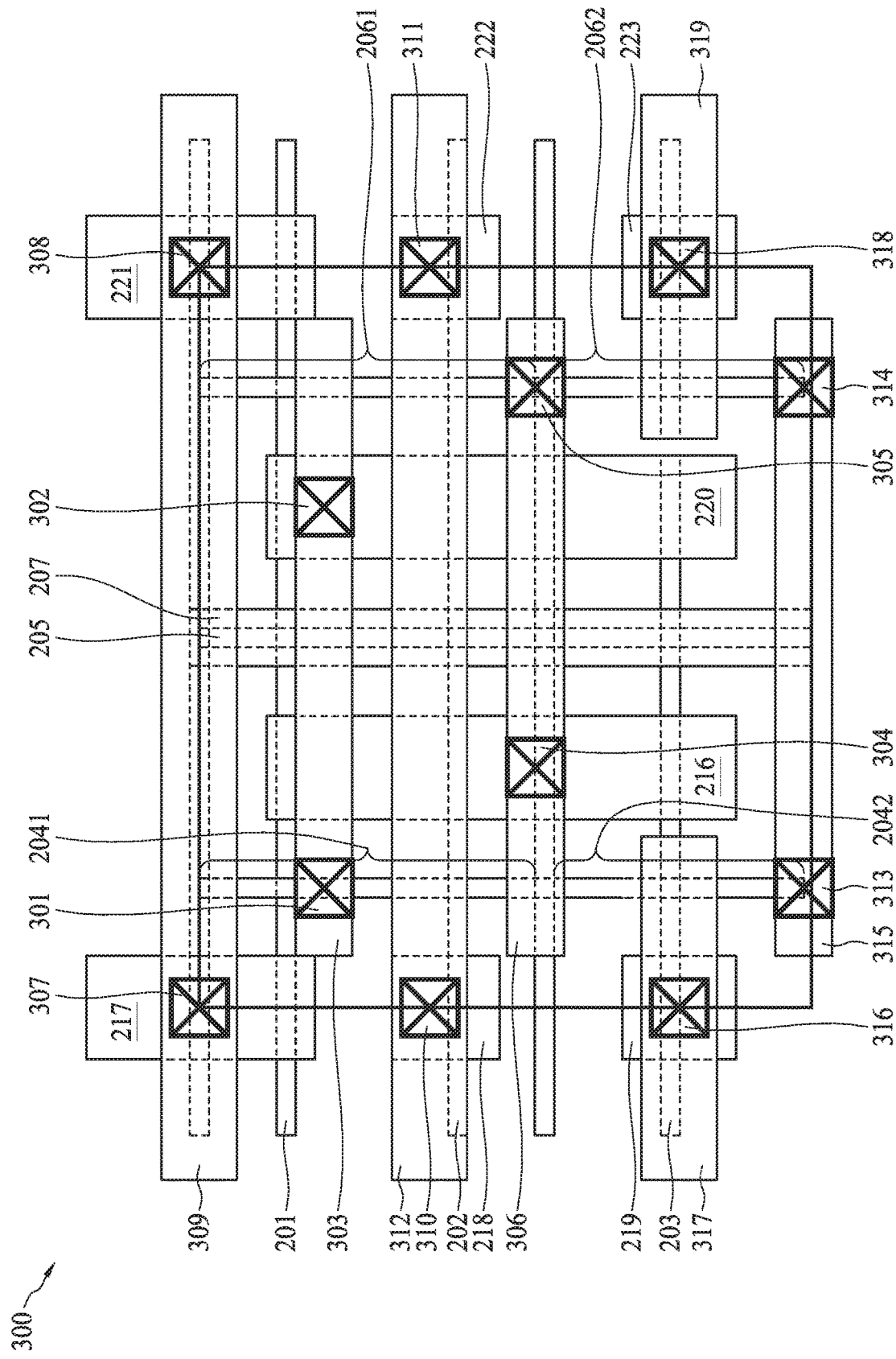
FIG. 3 is a diagram illustrating a layout design of an SRAM cell in FIG. 2 in accordance with some embodiments.

It is noted that FIG. 2 merely illustrates the layout design on the oxide diffusion layer, the polysilicon layer, and the metal contact layer of the SRAM cell 23. FIG. 3 is a diagram illustrating a layout design 300 of the polysilicon vias, contact vias, and the first metal layer of the SRAM cell 23 in accordance with some embodiments. In other words, FIG. 3 illustrates a partial of the back-end-of-line (BEOL) patterns of the SRAM cell 23. The partial of the BEOL patterns may be the lower portion of the SRAM cell 23. For the purpose of description, the layout elements of the SRAM cell 23 in FIG. 2 is also shown in FIG. 3.

According to some embodiments, a polysilicon via layout 301 is disposed on the polysilicon portion 2041. A contact via layout 302 is disposed on the contact layout 220. A metal layout 303 is disposed on the polysilicon via layout 301 and the contact via layout 302 for connecting the polysilicon portion 2041 and the contact layout 220.

A contact via layout 304 is disposed on the contact layout 216. A polysilicon via layout 305 is disposed on the polysilicon portion 2061. A metal layout 306 is disposed on the contact via layout 304 and the polysilicon via layout 305 for connecting the contact layout 216 and the polysilicon portion 2061.

A contact via layout 307 is disposed on the contact layout 217. A contact via layout 308 is disposed on the contact layout 221. A metal layout 309 is disposed on the contact via layout 307 and the contact via layout 308 for connecting the contact layout 217 and the contact layout 221.

A contact via layout 310 is disposed on the contact layout 218. A contact via layout 311 is disposed on the contact layout 222. A metal layout 311 is disposed on the contact via layout 310 and the contact via layout 311 for connecting the contact layout 218 and the contact layout 222.

A polysilicon via layout 313 is disposed on the polysilicon portion 2042. A polysilicon via layout 314 is disposed on the polysilicon portion 2062. A metal layout 315 is disposed on the polysilicon via layout 313 and the polysilicon via layout 314 for connecting the polysilicon portion 2042 and the polysilicon portion 2062.

Moreover, a contact via layout 316 is disposed on the contact layout 219, and a metal layout 317 is disposed on the contact via layout 316. A contact via layout 318 is disposed on the contact layout 223, and a metal layout 319 is disposed on the contact via layout 318.

According to some embodiments, the metal layouts 303, 306, 309, 312, 315, 317, and 319 are the first metal layer or the lowest metal layer above the substrate layout of the SRAM cell 23, and the metal layouts 303, 306, 309, 312, 315, 317, and 319 are arranged to be horizontal layout in FIG. 3. The contact via layouts 302, 304, 307, 308, 310, and 311 are vias interposed between the contact layer and the first metal layer on the substrate layout. The polysilicon via layouts 301, 305, 313, and 314 are vias interposed between the polysilicon layer and the first metal layer on the substrate layout.

Figure 4:
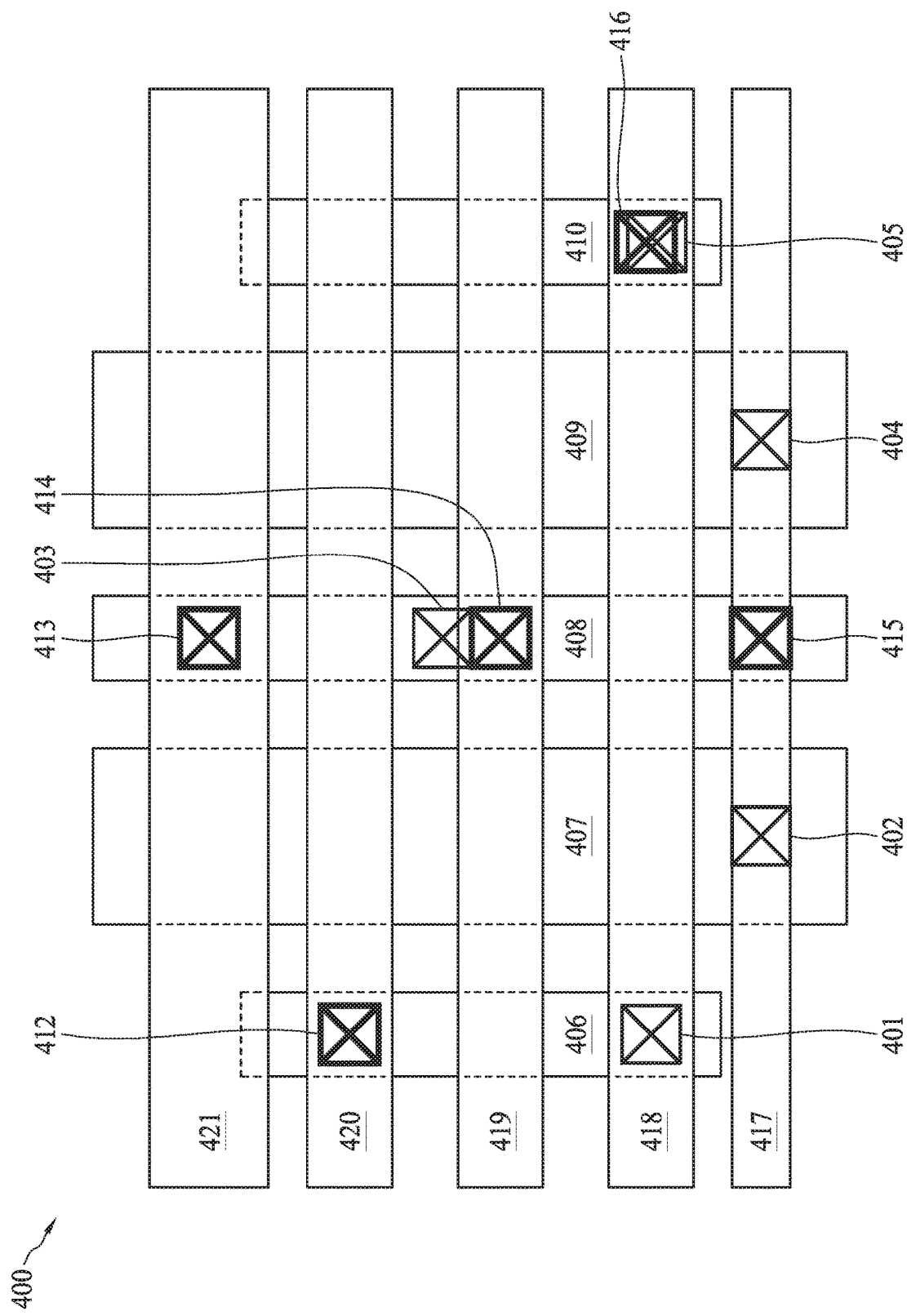
FIG. 4 is a diagram illustrating a layout design of an SRAM cell in FIG. 2 in accordance with some embodiments.

It is noted that FIG. 3 merely illustrates the lower portion of the BEOL patterns of the SRAM cell. FIG. 4 is a diagram illustrating a layout design 400 of metal via layer, the second metal layer, and the third metal layer of the SRAM cell 23 in accordance with some embodiments. In other words, FIG. 4 illustrates the higher portion of the BEOL patterns of the SRAM cell 23. It is noted that the layout design 400 is disposed above the layout design 300. Please refer to FIG. 4 together with FIG. 3, the layout design 400 comprises a via layout 401 disposed on the metal layout 317. A via layout 402 is disposed on the metal layout 315. A via layout 403 is disposed on the metal layout 312. A via layout 404 is disposed on the metal layout 315. A via layout 405 is disposed on the metal layout 319.

A metal layout 406 is disposed on the via layout 401. A metal layout 407 is disposed on the via layout 402. A metal layout 408 is disposed on the via layout 403. A metal layout 409 is disposed on the via layout 404. A metal layout 410 is disposed on the via layout 405. The metal layouts 406~410 are the second metal layer above the substrate layout of the SRAM cell 23, and the metal layouts 406-410 are arranged to be vertical layout in FIG. 4. The via layouts 401~405 are vias interposed between the first metal layer and the second metal layer on the substrate layout.

A via layout 412 is disposed on the metal layout 406. Three via layouts 413, 414, and 415 are disposed on the metal layout 408. A via layout 416 is disposed on the metal layout 410.

A metal layout 417 is disposed on the via layout 415. A metal layout 418 is disposed on the via layout 416. A metal layout 419 is disposed on the via layout 414. A metal layout 420 is disposed on the via layout 412. A metal layout 421 is disposed on the via layout 413. The metal layouts 406~410 are the third metal layer above the substrate layout of the SRAM cell 23, and the metal layouts 417~421 are arranged to be horizontal layout in FIG. 4. The via layouts 412~416 are vias interposed between the second metal layer and the third metal layer on the substrate layout.

After the fabrication of the SRAM cell, the metal layout 309 is electrically connected to the supply voltage (e.g. VDD in FIG. 1). The metal layouts 417, 419, and 421 are electrically connected to the ground voltage (e.g. GND in FIG. 1). The metal layouts 407 and 409 are the word line (e.g. the word line WL in FIG. 1) of the SRAM cell. The metal layout 420 is the first bit line (e.g. the first bit line BL0 in FIG. 1) of the SRAM cell. The metal layout 418 is the second bit line (e.g. the second bit line BL1 in FIG. 1) of the SRAM cell.

Please refer to FIG. 3 again, as three polysilicon layouts (i.e. 204, 205, 206) are applied to form the layout design 300 of the SRAM cell 23, the width of the layout design 300 of the SRAM cell 23 is three contacted poly-pitches (i.e. 3CPP).

Moreover, in FIG. 2 and FIG. 3, the patterns of the oxide diffusion areas, the polysilicon layouts, the poly-remove layouts, and the cut-poly layouts are relatively simple and process friendly. Specifically, in FIG. 2 and FIG. 3, the oxide diffusion areas, the polysilicon layouts, the poly-remove layouts, and the cut-poly layouts are continuous layout in the layout design 200 of the SRAM circuit. When the layouts of the oxide diffusion areas, the polysilicon layouts, the poly-remove layouts, and the cut-poly layouts are continuous, the complexity of the corresponding masks for fabricating the SRAM circuit is reduced. Accordingly, the cost of fabricating the SRAM circuit is also reduced.

Please refer to FIG. 3 again, each of the transistors 209~214 mere has one fin. i.e. one oxide diffusion area. However, this is not the limitation of the present embodiment. The number of the fins (or size) of the pull-up transistors 209 and 212, the fins of the pull-down transistors 210 and 213, and/or the fins of the pass-gate transistors 211 and 214 can be adjusted. Specifically, due to the mirror-symmetric arrangement of the transistors 209~214, the size ratio of the pull-up transistor 209 (or 212) over the pull-down transistor 210 (or 213), the size ratio of the pull-down transistor 210 (or 213) over the pass-gate transistor 211 (or 214), and the size ratio of the pull-up transistor 209 (or 212) over the pass-gate transistor 211 (or 214) can be controlled by adjusting the number of the oxide diffusion areas.

Figure 5:
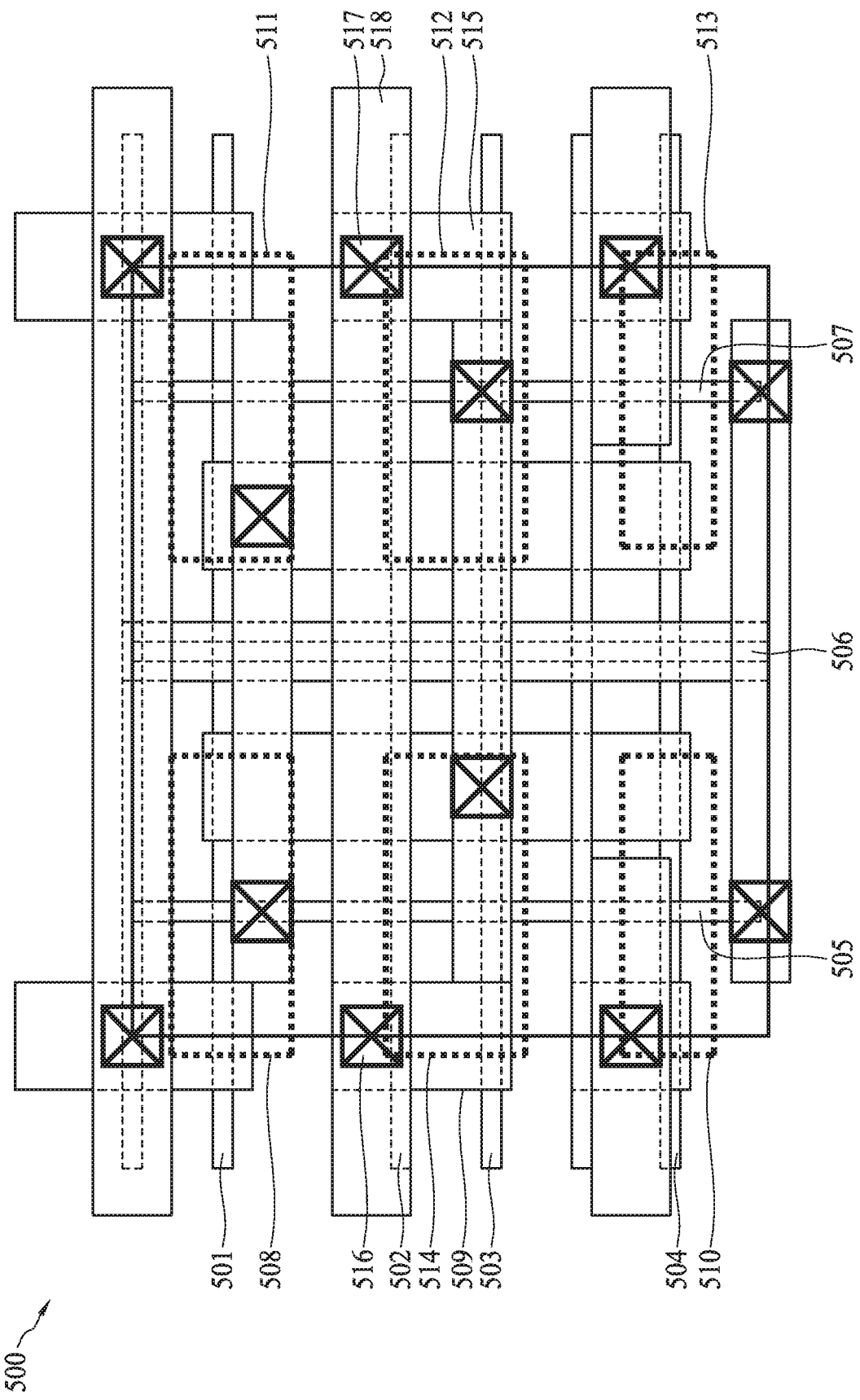
FIG. 5 is a diagram illustrating a layout design of an SRAM cell of FIG. 1 in accordance with some embodiments.

FIG. 5 is a diagram illustrating a layout design 500 of an SRAM cell in accordance with some embodiments. The layout design 500 merely shows the polysilicon vias, contact vias, and the first metal layer (i.e. the lower portion of the BEOL patterns) of an SRAM cell. In FIG. 5, a first pull-up transistor 508 is formed on an area around the intersection of an oxide diffusion area 501 and a polysilicon layout 505. A first pull-down transistor 509 is formed on an area around the intersection of two oxide diffusion areas 502, 503 and the polysilicon layout 505. A first pass-gate transistor 510 is formed on an area around the intersection of an oxide diffusion area 504 and the polysilicon layout 505. A second pull-up transistor 511 is formed on an area around the intersection of the oxide diffusion area 501 and a polysilicon layout 507. A second pull-down transistor 512 is formed on an area around the intersection of the two oxide diffusion areas 502, 503 and the polysilicon layout 507. A second pass-gate transistor 513 is formed on an area around the intersection of the oxide diffusion area 504 and the polysilicon layout 507. In the SRAM cell, the pull-up transistors 508, 511 and the pass-gate transistors 510, 513 are one-fin transistor, and the pull-down transistors 509 and 512 are two-fin transistor. Accordingly, in comparison to the layout design 300, the size of the pull-down transistors 509 and 512 can be doubled by merely adding one more oxide diffusion area (e.g. 503) adjacent to the oxide diffusion area (e.g. 502).

When the pull-down transistors 509 and 512 comprises two oxide diffusion areas 502 and 503, the layout design of the contact layout and the metal layouts of the first metal layer on the pull-down transistors 509 and 512 may be slight adjusted in comparison to the layout design 300. According to some embodiments, a contact layout 514 is disposed over the two oxide diffusion areas 502 and 503 on the left side of the polysilicon layout 505. A contact layout 515 is disposed over the two oxide diffusion areas 502 and 503 on the right side of the polysilicon layout 507. A contact via layout 516 is disposed on the contact layout 514. A contact via layout 517 is disposed on the contact layout 515. A metal layout 518 is disposed on the contact via layout 516 and the contact via layout 517 for connecting the contact layout 514 and the contact layout 515. It is noted that the layout design of the pull-up transistors 508, 511 and the pass-gate transistors 510, 513 are similar to the layout design of the pull-up transistors 209, 212 and the pass-gate transistors 211, 214, and the detailed description is omitted here for brevity.

According to the layout design 500, the size ratio of the pull-up transistor 508 (or 511) over the pull-down transistor 509 (or 512) is 1:2, the size ratio of the pull-down transistor 509 (or 512) over the pass-gate transistor 510 (or 513) is 2:1, and the size ratio of the pull-up transistor 508 (or 511) over the pass-gate transistor 510 (or 513) is 1:1.

Figure 6:
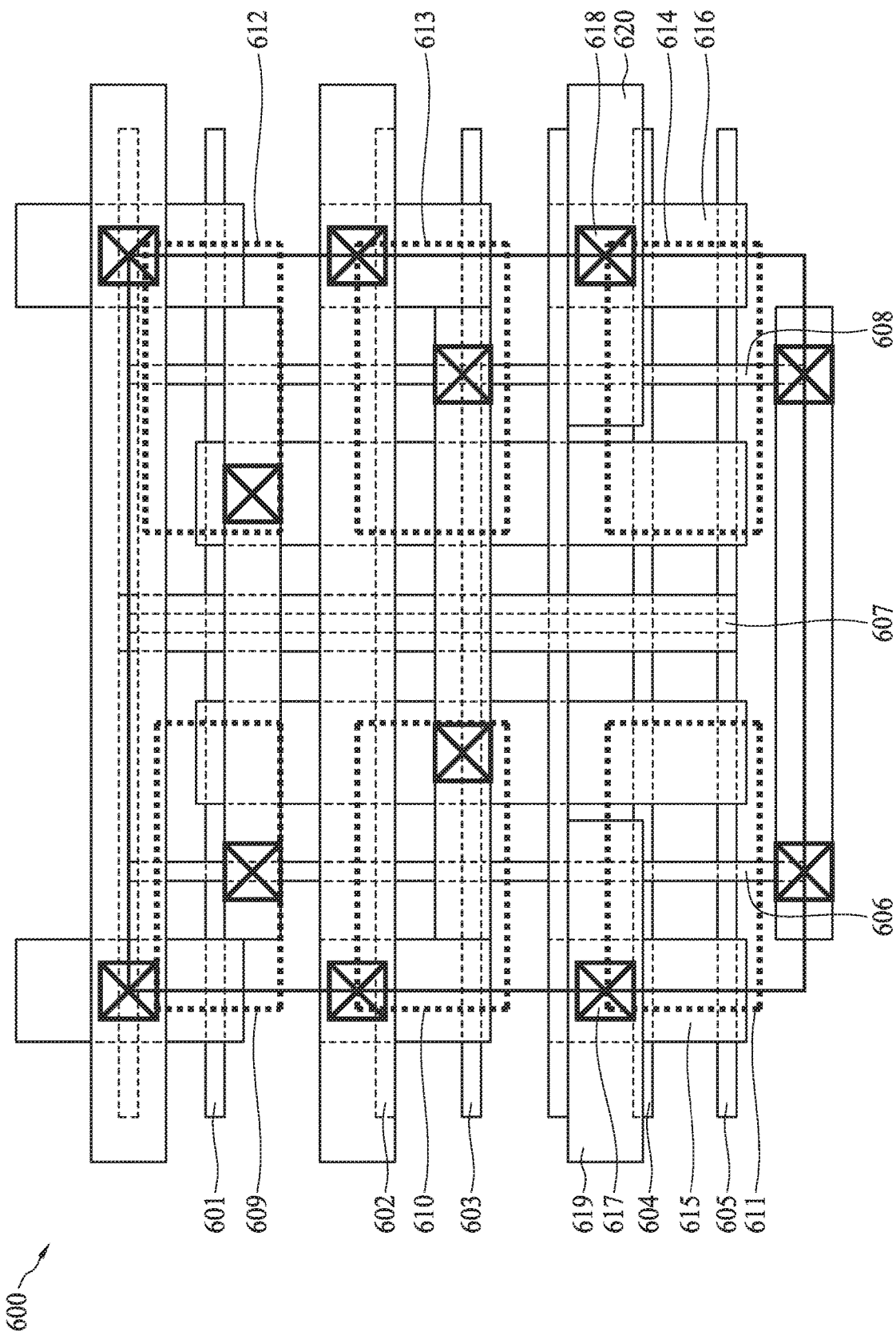
FIG. 6 is a diagram illustrating a layout design of an SRAM cell of FIG. 1 in accordance with some embodiments.

FIG. 6 is a diagram illustrating a layout design 600 of an SRAM cell in accordance with some embodiments. The layout design 600 merely shows the polysilicon vias, contact vias, and the first metal layer (i.e. the lower portion of the BEOL patterns) of an SRAM cell. In FIG. 6, a first pull-up transistor 609 is formed on an area around the intersection of an oxide diffusion area 601 and a polysilicon layout 606. A first pull-down transistor 610 is formed on an area around the intersection of two oxide diffusion areas 602, 603 and the polysilicon layout 606. A first pass-gate transistor 611 is formed on an area around the intersection of two oxide diffusion areas 604, 605 and the polysilicon layout 606. A second pull-up transistor 612 is formed on an area around the intersection of the oxide diffusion area 601 and a polysilicon layout 608. A second pull-down transistor 613 is formed on an area around the intersection of the two oxide diffusion areas 602, 603 and the polysilicon layout 608. A second pass-gate transistor 614 is formed on an area around the intersection of the two oxide diffusion area 604, 605 and the polysilicon layout 608. In the SRAM cell, the pull-up transistors 609 and 612 are one-fin transistor, and the pull-down transistors 610 and 613 and the pass-gate transistors 611 and 614 are two-fin transistor. Accordingly, in comparison to the layout design 500, the size of the pass-gate transistors 611 and 614 can be doubled by merely adding one more oxide diffusion area (e.g. 605) adjacent to the oxide diffusion area (e.g. 604).

When the pass-gate transistors 510 and 513 comprises two oxide diffusion areas 604 and 605, the layout design of the contact layout and the metal layouts of the first metal layer on the pass-gate transistors 510 and 513 may be slight adjusted in comparison to the layout design 500. According to some embodiments, a contact layout 615 is disposed over the two oxide diffusion areas 604 and 605 on the left side of the polysilicon layout 606. A contact layout 616 is disposed over the two oxide diffusion areas 604 and 605 on the right side of the polysilicon layout 608. A contact via layout 617 is disposed on the contact layout 615. A contact via layout 618 is disposed on the contact layout 614. A metal layout 619 is disposed on the contact via layout 617 for connecting the contact layout 615. A metal layout 620 is disposed on the contact via layout 618 for connecting the contact layout 614. It is noted that the layout design of the pull-up transistors 609, 612 and the pull-down transistors 610, 613 are similar to the layout design of the pull-up transistors 508, 511 and the pull-down transistors 509, 512, and the detailed description is omitted here for brevity.

According to the layout design 600, the size ratio of the pull-up transistor 609 (or 612) over the pull-down transistor 610 (or 613) is 1:2, the size ratio of the pull-down transistor 610 (or 613) over the pass-gate transistor 611 (or 614) is 1:1, and the size ratio of the pull-up transistor 609 (or 612) over the pass-gate transistor 611 (or 614) is 1:2.

Figure 7:
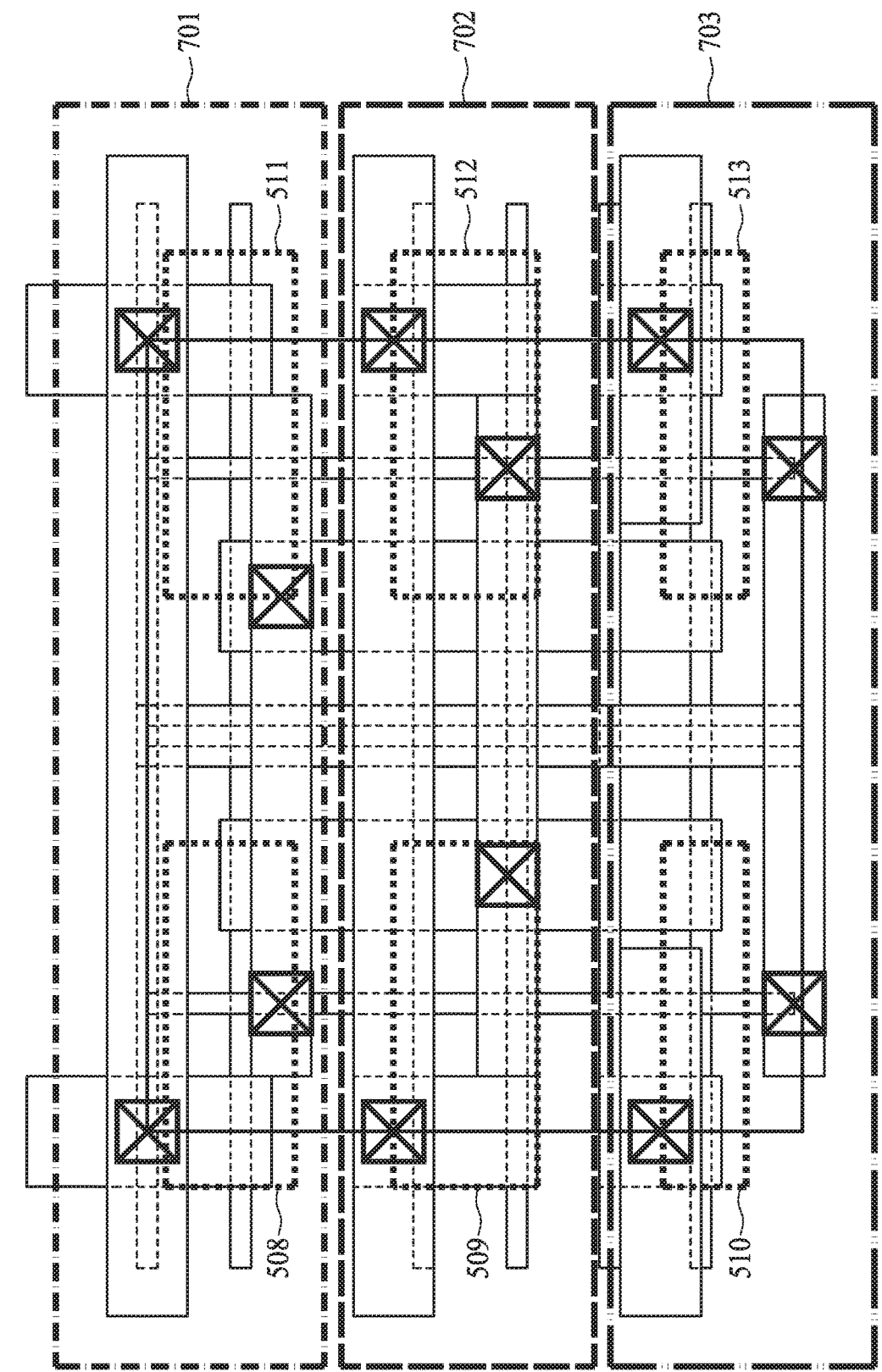
FIG. 7 is a diagram illustrating a layout design of an SRAM cell of FIG. 1 in accordance with some embodiments.

FIG. 7 is a diagram illustrating a layout design 700 of an SRAM cell in accordance with some embodiments. In comparison to the layout design 500, the layout design 700 further comprises a first doping region 701, a second doping region 702, and a third doping region 703. The pull-up transistors 508 and 511, the pull-down transistors 509 and 512, and the pass-gate transistors 510 and 513 are formed in the first doping region 701, the second doping region 702, the third doping region 703 respectively. According to some embodiments, the dopant concentrations of the first doping region 701, the second doping region 702, and the third doping region 703 can be adjusted independently. Therefore, the threshold voltages (VTH) of the pull-up transistors 508 and 511, the pull-down transistors 509 and 512, and the pass-gate transistors 510, 513 can be designed to have different threshold voltages respectively.

Figure 8:
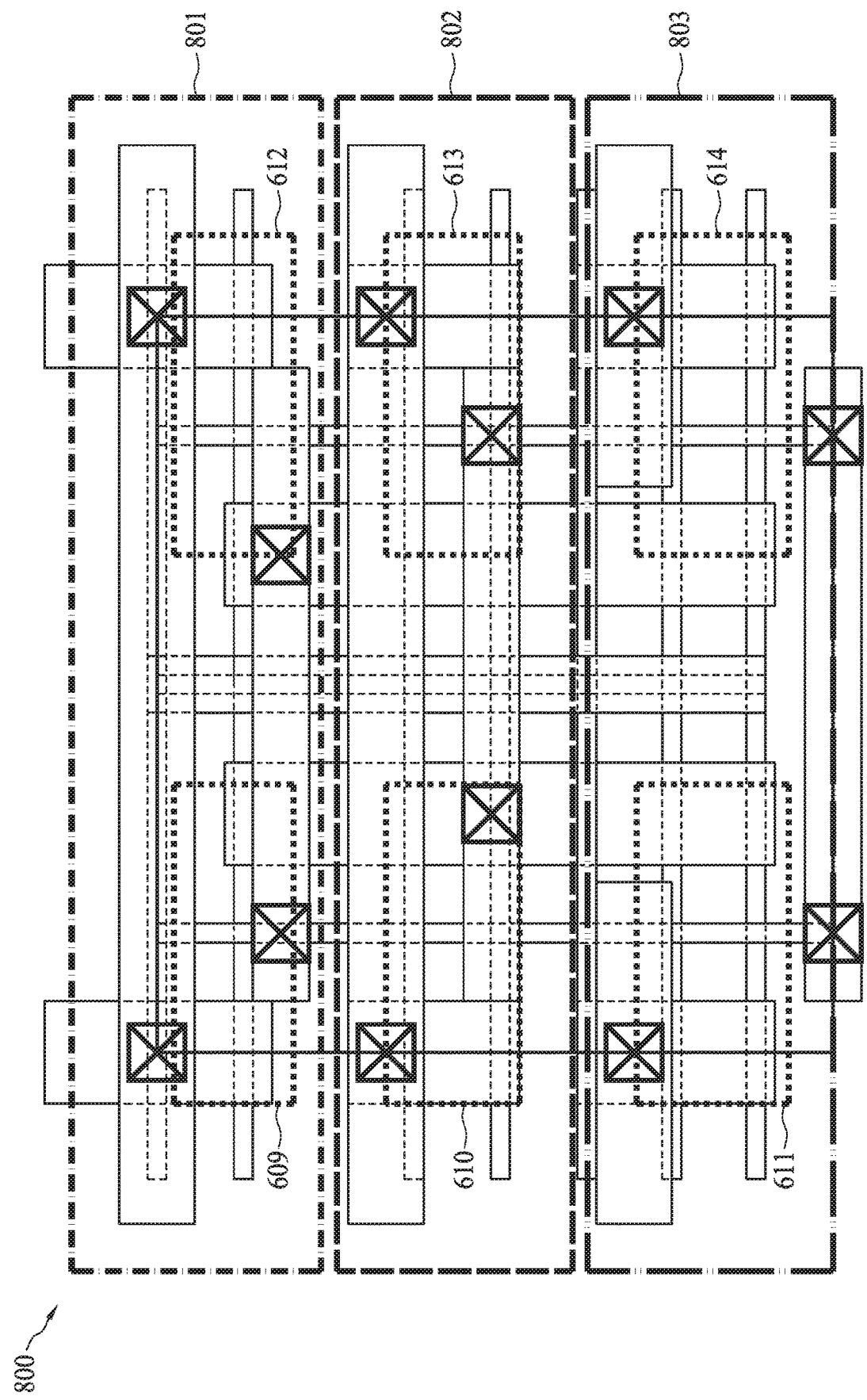
FIG. 8 is a diagram illustrating a layout design of an SRAM cell of FIG. 1 in accordance with some embodiments.

FIG. 8 is a diagram illustrating a layout design 800 of an SRAM cell in accordance with some embodiments. In comparison to the layout design 600, the layout design 800 further comprises a first doping region 801, a second doping region 802, and a third doping region 803. The pull-up transistors 609 and 612, the pull-down transistors 610 and 613, and the pass-gate transistors 611 and 614 are formed in the first doping region 801, the second doping region 802, the third doping region 803 respectively. According to some embodiments, the dopant concentrations of the first doping region 801, the second doping region 802, and the third doping region 803 can be adjusted independently. Therefore, the threshold voltages (VTH) of the pull-up transistors 609 and 612, the pull-down transistors 610 and 613, and the pass-gate transistors 611 and 614 can be designed to have different threshold voltages respectively.

Figure 9:
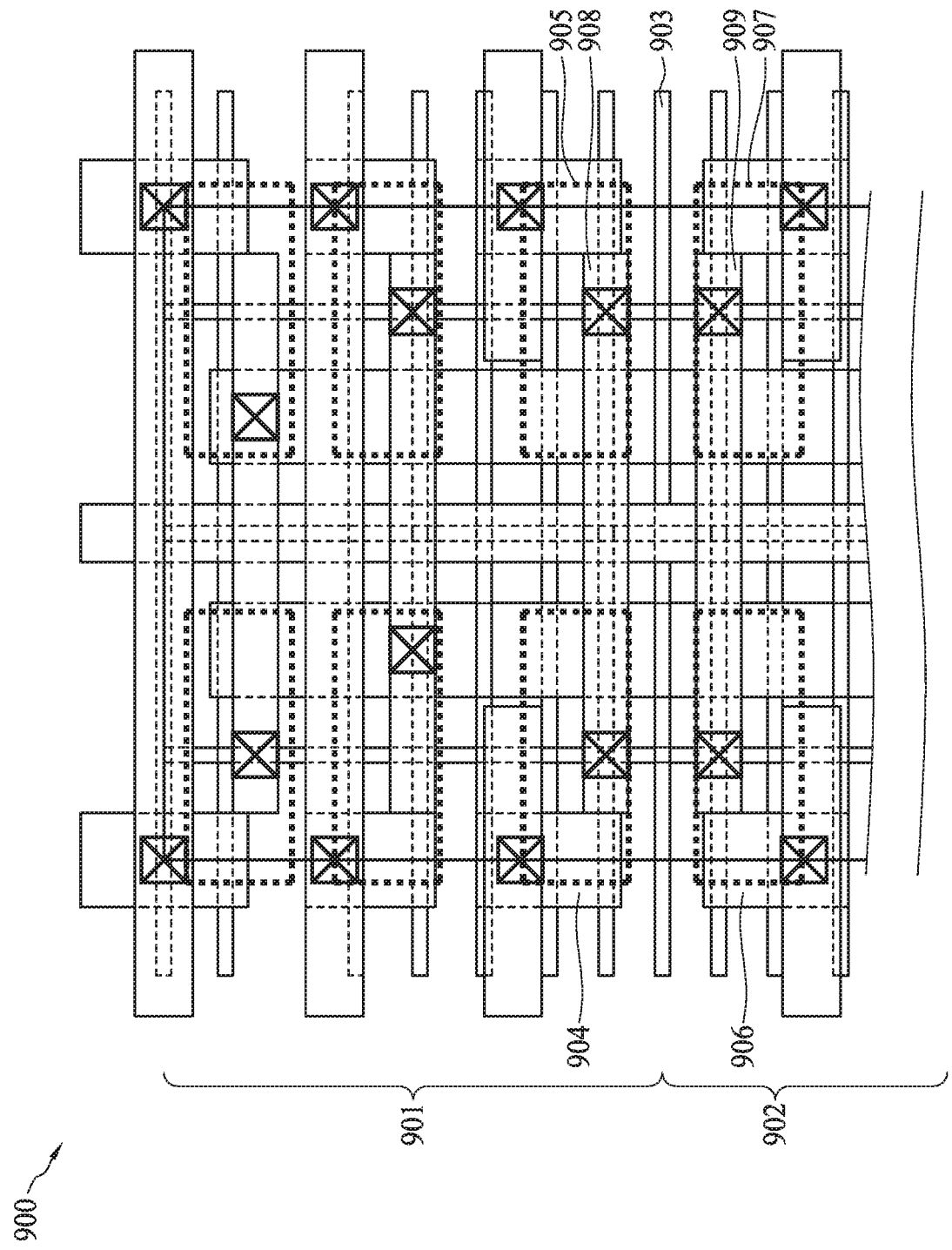
FIG. 9 is a diagram illustrating a layout design of two SRAM cells in accordance with some embodiments.

FIG. 9 is a diagram illustrating a layout design 900 in accordance with some embodiments. The layout design 900 comprises two layout designs 901 and 902 corresponding to two SRAM cells respectively. For brevity, each of the layout designs 901 and 902 is similar to the layout design 600. According to some embodiments, a cut-poly layout 2081 is disposed on the interface between the layout design 23 and the layout design 21. A cut-poly layout 903 is disposed across the polysilicon layouts 606, 607, and 608 for dividing the polysilicon layouts 606, 607, and 608 in the layout design 902 from the layout design 901.

The layout design 901 and the layout design 902 are mirror-symmetric with respect to the cut-poly layout 903. For example, the pass-gate transistors 904, 905 and the pass-gate transistors 906, 907 are mirror-symmetric with respect to the cut-poly layout 903.

Figure 10:
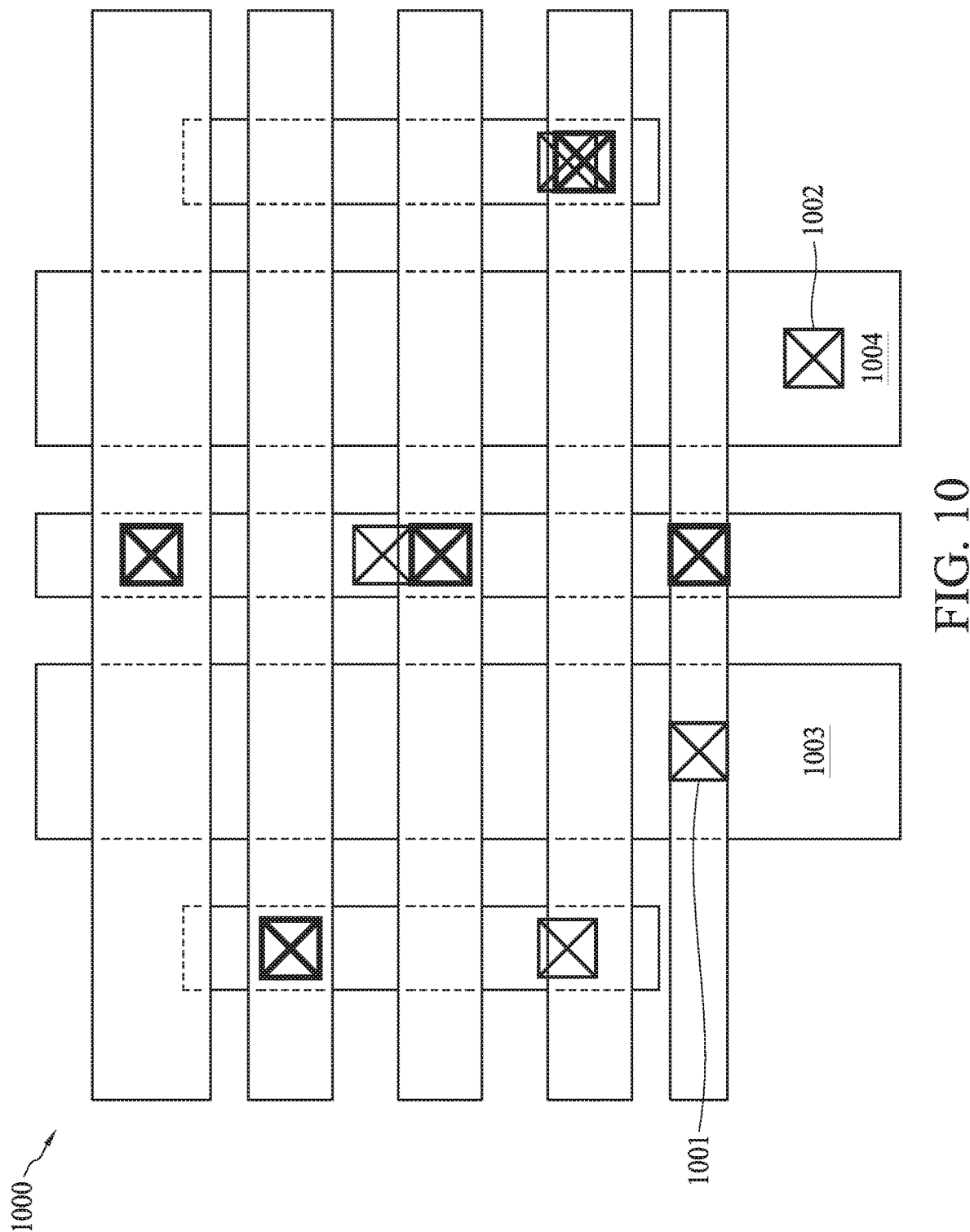
FIG. 10 is a diagram illustrating a layout design of the two SRAM cells of FIG. 9 in accordance with some embodiments.

It is noted that FIG. 9 merely illustrates the FEOL patterns, the MEOL patterns, and the lower portion of BEOL patterns of the SRAM cell. FIG. 10 is a diagram illustrating a layout design 1000 of metal via layer, the second metal layer, and the third metal layer of the SRAM cell of FIG. 9 in accordance with some embodiments. In other words, FIG. 10 illustrates the higher portion of the BEOL patterns of the SRAM cell of FIG. 9. It is noted that the layout design 1000 is disposed above the layout design 900. Please refer to FIG. 10 together with FIG. 9, the layout design 1000 comprises a via layout 1001 disposed on the metal layout 908 of the pass-gate transistors 904, 905 in FIG. 9. A via layout 1002 disposed on the metal layout 909 of the pass-gate transistors 906, 907 in FIG. 9. A metal layout 1003 is disposed on the via layout 1001. A metal layout 1004 is disposed on the via layout 1002.

The metal layouts 908 and 909 are located on the first metal layer above the substrate layout of the SRAM cell, and the metal layouts 1003 and 1004 are located on the second metal layer above the substrate layout of the SRAM cell. The via layouts 1001 and 1002 are vias interposed between the first metal layer and the second metal layer on the substrate layout.

According to some embodiments, the metal layout 1003 is the word line of the upper SRAM cell (i.e. 901). The metal layout 1004 is the word line of the lower SRAM cell (i.e. 902). As the polysilicon layouts 606, 607, and 608 of the layout design 901 and the layout design 902 are cut-off by the cut-poly layout 903, the pass-gate transistors 904, 905 and the pass-gate transistors 906, 907 can be separately controlled by their respective word lines (i.e. the metal layout 1003 and the metal layout 1004. For example, during an operation of the upper SRAM cell and the lower SRAM cell, the pass-gate transistors 904, 905 may be turned on or activated by the voltage on the word line (i.e. the metal layout 1003) of the upper SRAM cell, and the pass-gate transistors 906, 907 may be turned off or deactivated by the voltage on the word line (i.e. the metal layout 1004) of the lower SRAM cell. Accordingly, the power consumption of the SRAM circuit is reduced.

Figure 11:
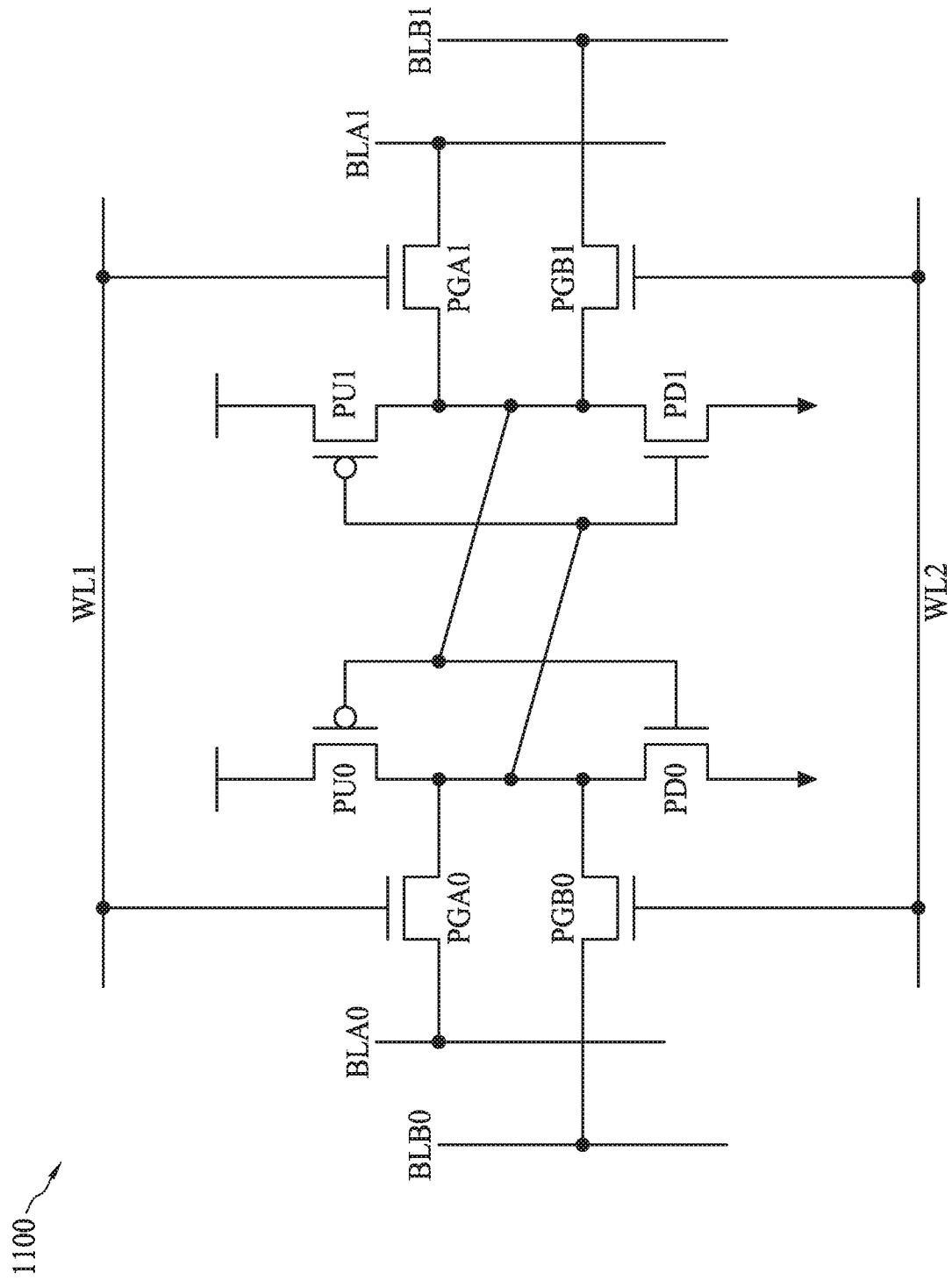
FIG. 11 is a circuit diagram illustrating a static random-access memory cell.

FIG. 11 is a circuit diagram illustrating a static random-access memory (SRAM) cell 1100. The SRAM cell 1100 comprises eight transistors PGA0, PGB0, PU0, PD0, PU1, PD1, PGA1, PGB1. The transistors PGA0, PGB0, PGA, PGB1, PD0, and PD1 are N-type field-effect transistor, and the transistors PU0 and PU1 are P-type field-effect transistor. In comparison to the SRAM cell 100, the SRAM cell 1100 has four pass-gate transistors PGA0, PGB0, PGA1, PGB1. Therefore, the SRAM cell 1100 is a dual-port (DP) SRAM cell. The connectivity among the transistors PGA0, PGB0, PU0, PD0, PU1, PD1, PGA1, PGB1 is shown in FIG. 11, the detail description of the connectivity and the operation of the SRAM cell 1100 is omitted here for brevity.

Figure 12:
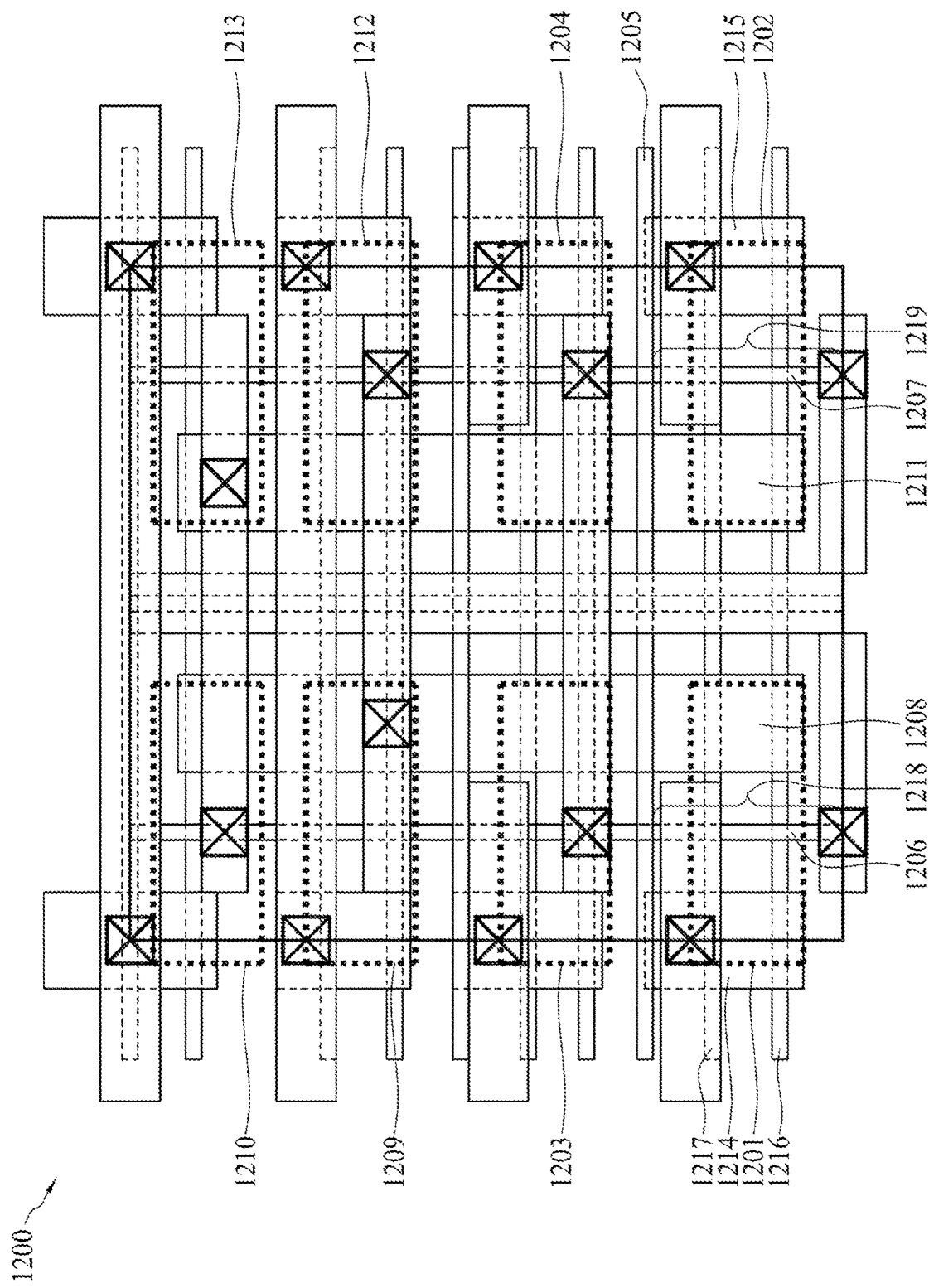
FIG. 12 is a diagram illustrating a layout design of an SRAM cell of FIG. 11 in accordance with some embodiments.

FIG. 12 is a diagram illustrating a layout design 1200 of the SRAM cell 1100 in accordance with some embodiments. For brevity, FIG. 12 merely illustrates the layout design of oxide diffusion layer, polysilicon layer, and metal contact layer on a substrate layout of the SRAM cell 1100. In comparison to the layout design 600, the layout design 1200 further comprises two pass-gate transistors 1201 and 1202 (i.e. PGB0 and PGB1 in FIG. 11) disposed adjacent to two pass-gate transistors 1203 and 1204 (i.e. PGA0 and PGA1 in FIG. 11) respectively. A cut-poly layout 1205 is disposed on the interface between the two pass-gate transistors 1201, 1202 and the two pass-gate transistors 1203, 1204. The cut-poly layout 1205 is disposed across the polysilicon layouts 1206 and 1207 for dividing the polysilicon layouts 1206 and 1207 in the pass-gate transistors 1201, 1202 and the pass-gate transistors 1203, 1204. In this embodiment, the substrate layout further comprises two oxide diffusion areas (for example) 1216 and 1217, and the polysilicon layouts 1206 and 1207 further extend across the oxide diffusion areas 1216 and 1217. The cut-poly layout 1205 is arranged for dividing the polysilicon layouts 1206 and 1207 to generate polysilicon portions 1218 and 1219 respectively. The pass-gate transistor 1201 is formed on the oxide diffusion areas 1216 and 1217 and the polysilicon portion 1218. The pass-gate transistor 1202 is formed on the oxide diffusion areas 1216 and 1217 and the polysilicon portion 1219. The contact layout 1208 is arranged to dispose on a portion of the oxide diffusion areas 1216 and 1217 on the right side of the polysilicon portion 1218. A contact layout 1214 is disposed on a portion of the oxide diffusion areas 1216 and 1217 on the left side of the polysilicon portion 1218. The contact layout 1211 is arranged to dispose on a portion of the oxide diffusion areas 1216 and 1217 on the left side of the polysilicon portion 1219. A contact layout 1215 is disposed on a portion of the oxide diffusion areas 1216 and 1217 on the right side of the polysilicon portion 1219.

The contact layout 1208 in the pass-gate transistor 1201, the pass-gate transistor 1203, the pull-down transistor 1209, and the pull-up transistor 1210 is a continuous contact layout. The contact layout 1211 in the pass-gate transistor 1202, the pass-gate transistor 1204, the pull-down transistor 1212, and the pull-up transistor 1213 is a continuous contact layout. The layout designs of the pass-gate transistors 1201, 1202 are similar to the pass-gate transistors 611 and 614 respectively, thus the detailed description is omitted here for brevity.

Figure 13:
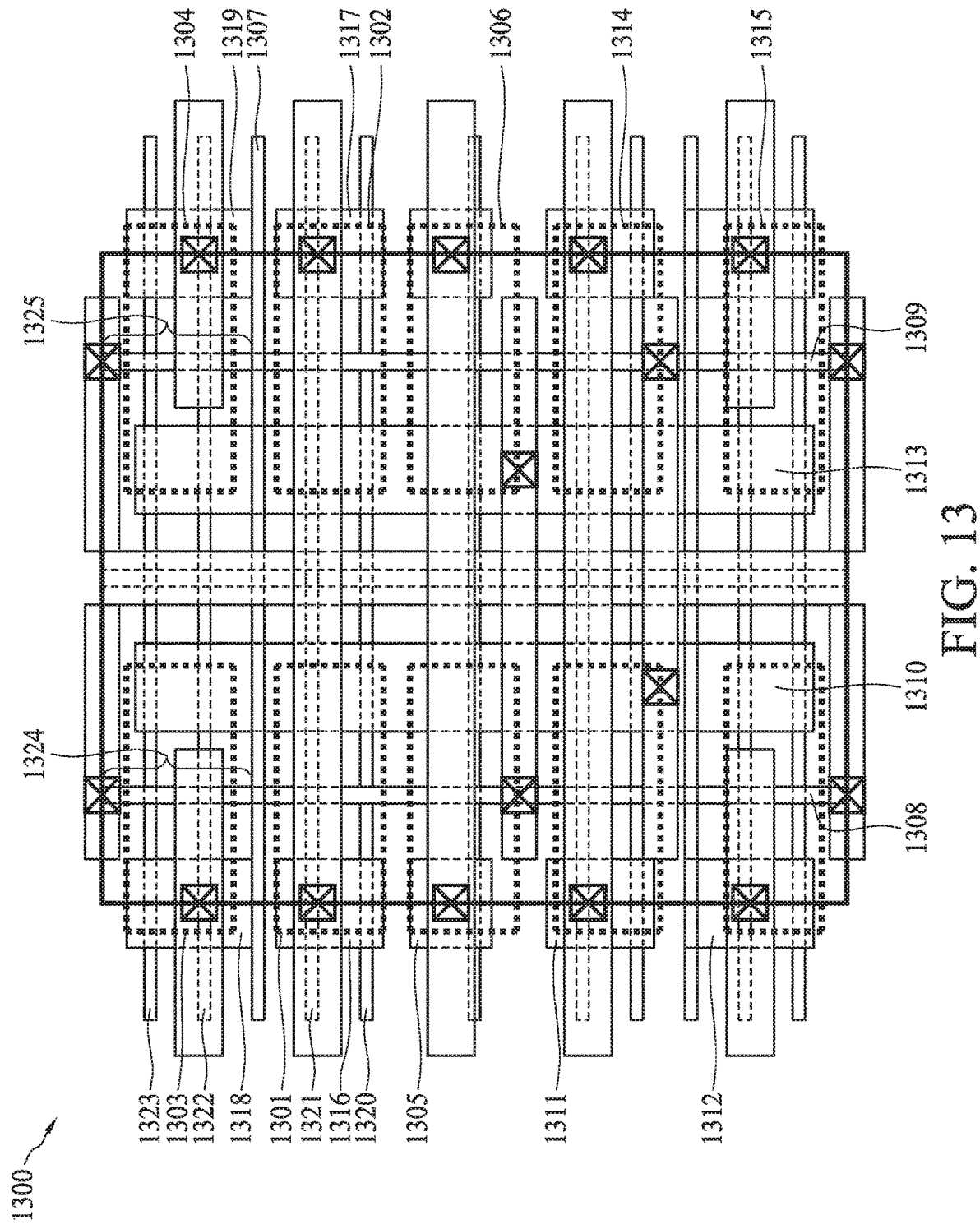
FIG. 13 is a diagram illustrating a layout design of an SRAM cell of FIG. 11 in accordance with some embodiments.

FIG. 13 is a diagram illustrating a layout design 1300 of the SRAM cell 1100 in accordance with some embodiments. For brevity, FIG. 13 merely illustrates the layout design of oxide diffusion layer, polysilicon layer, and metal contact layer on a substrate layout of the SRAM cell 1100. In comparison to the layout design 600, the layout design 1300 further comprises two pull-down transistors 1301, 1302 (i.e. PD0 and PD1 in FIG. 11) and two pass-gate transistors 1303, 1304 (i.e. PGB0 and PGB1 in FIG. 11). The two pull-down transistors 1301, 1302 are disposed adjacent to two pull-up transistors 1305 and 1306 (i.e. PU0 and PU1 in FIG. 11) respectively. A cut-poly layout 1307 is disposed on the interface between the two pull-down transistors 1301, 1302 and the two pass-gate transistors 1303, 1304. The cut-poly layout 1307 is disposed across the polysilicon layouts 1308 and 1309 for dividing the polysilicon layouts 1308 and 1309 in the pull-down transistors 1301, 1302 and the pass-gate transistors 1303, 1304.

In this embodiment, the substrate layout further comprises four oxide diffusion areas (for example) 1320, 1321, 1322, and 1323, and the polysilicon layouts 1308 and 1309 further extend across the oxide diffusion areas 1320, 1321, 1322, and 1323. The cut-poly layout 1307 is arranged for dividing the polysilicon layouts 1308 and 1309 to generate polysilicon portions 1324 and 1325 respectively. The pull-down transistor 1301 is formed on the oxide diffusion areas 1320 and 1321 and the polysilicon layout 1308. The pull-down transistor 1302 is formed on the oxide diffusion areas 1320 and 1321 and the polysilicon layout 1309. The pass-gate transistor 1303 is formed on the oxide diffusion areas 1322 and 1323 and the polysilicon portion 1324. The pass-gate transistor 1304 is formed on the oxide diffusion areas 1322 and 1323 and the polysilicon portion 1325. The contact layout 1310 is arranged to dispose on a portion of the oxide diffusion areas 1320 and 1321 on the right side of the polysilicon layout 1308 and a portion of the oxide diffusion areas 1322 and 1323 on the right side of the polysilicon portion 1324. A contact layout 1316 is disposed on a portion of the oxide diffusion areas 1320 and 1321 on the left side of the polysilicon layout 1308. A contact layout 1318 is disposed on a portion of the oxide diffusion areas 1320 and 1321 on the left side of the polysilicon portion 1324. The contact layout 1313 is arranged to dispose on a portion of the oxide diffusion areas 1320 and 1321 on the left side of the polysilicon layout 1309 and a portion of the oxide diffusion areas 1322 and 1323 on the left side of the polysilicon portion 1325. A contact layout 1317 is disposed on a portion of the oxide diffusion areas 1320 and 1321 on the right side of the polysilicon layout 1309. A contact layout 1319 is disposed on a portion of the oxide diffusion areas 1322 and 1323 on the right side of the polysilicon portion 1325.

The contact layout 1310 in the pass-gate transistor 1303, the pull-down transistor 1301, the pull-up transistor 1305, the pull-down transistor 1311, and the pass-gate transistor 1312 is a continuous contact layout. The contact layout 1313 in the pass-gate transistor 1304, the pull-down transistor 1302, the pull-up transistor 1306, the pull-down transistor 1314, and the pass-gate transistor 1315 is a continuous contact layout. The layout designs of the pull-down transistors 1301 and 1302 are similar to the pull-down transistors 610 and 613 respectively, and the layout designs of the pass-gate transistors 1303 and 1304 are similar to the pass-gate transistors 611 and 614 respectively, thus the detailed description is omitted here for brevity.

Figure 14:
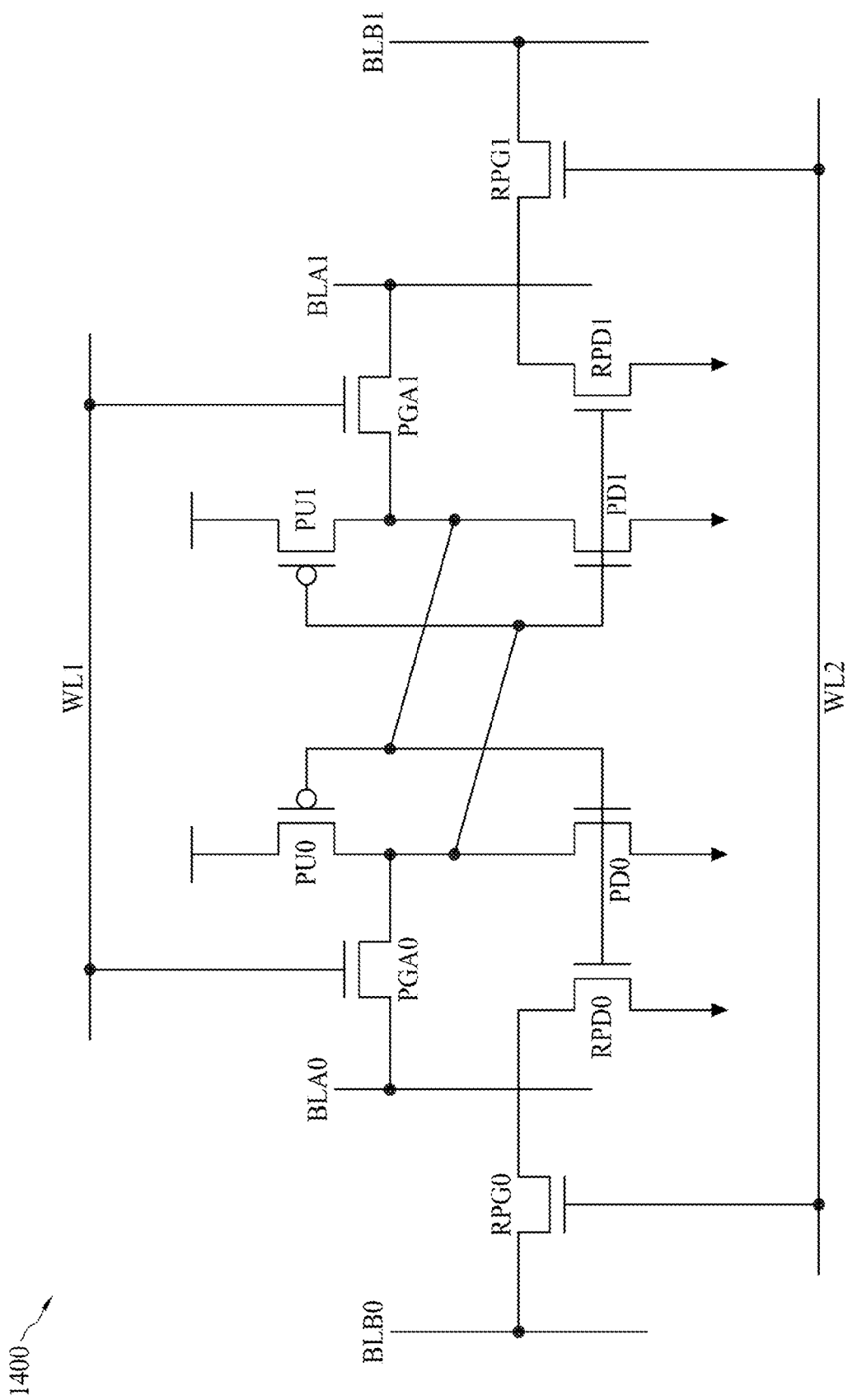
FIG. 14 is a circuit diagram illustrating a static random-access memory cell.

FIG. 14 is a circuit diagram illustrating a static random-access memory (SRAM) cell 1400. The SRAM cell 1400 comprises ten transistors RPG0, PGA0, RPD0, PU0, PD0, PU1, PD1, PGA1, RPG1, PPD1. The transistors RPG0, PGA0, RPD0, PD0, PD1, PGA1, RPG1, and PPD1 are N-type field-effect transistor, and the transistors PU0 and PU1 are P-type field-effect transistor. In comparison to the SRAM cell 100, the SRAM cell 1400 has four pass-gate transistors PGA0, PGB0, PGA1, PGB1 and four pull-down transistors RPD0, PD0, RPD1, PD1. Therefore, the SRAM cell 1400 is a dual-port ten-transistor (2P10T) SRAM cell. The connectivity among the transistors RPG0, PGA0, RPD0, PU0, PD0, PU1, PD1, PGA1, RPG1, PPD1 is shown in FIG. 14, the detail description of the connectivity and the operation of the SRAM cell 1400 is omitted here for brevity. It is noted that the transistors RPD0 and RPD1 are the mirror transistors of the transistors PD0 and PD1 respectively.

Figure 15:
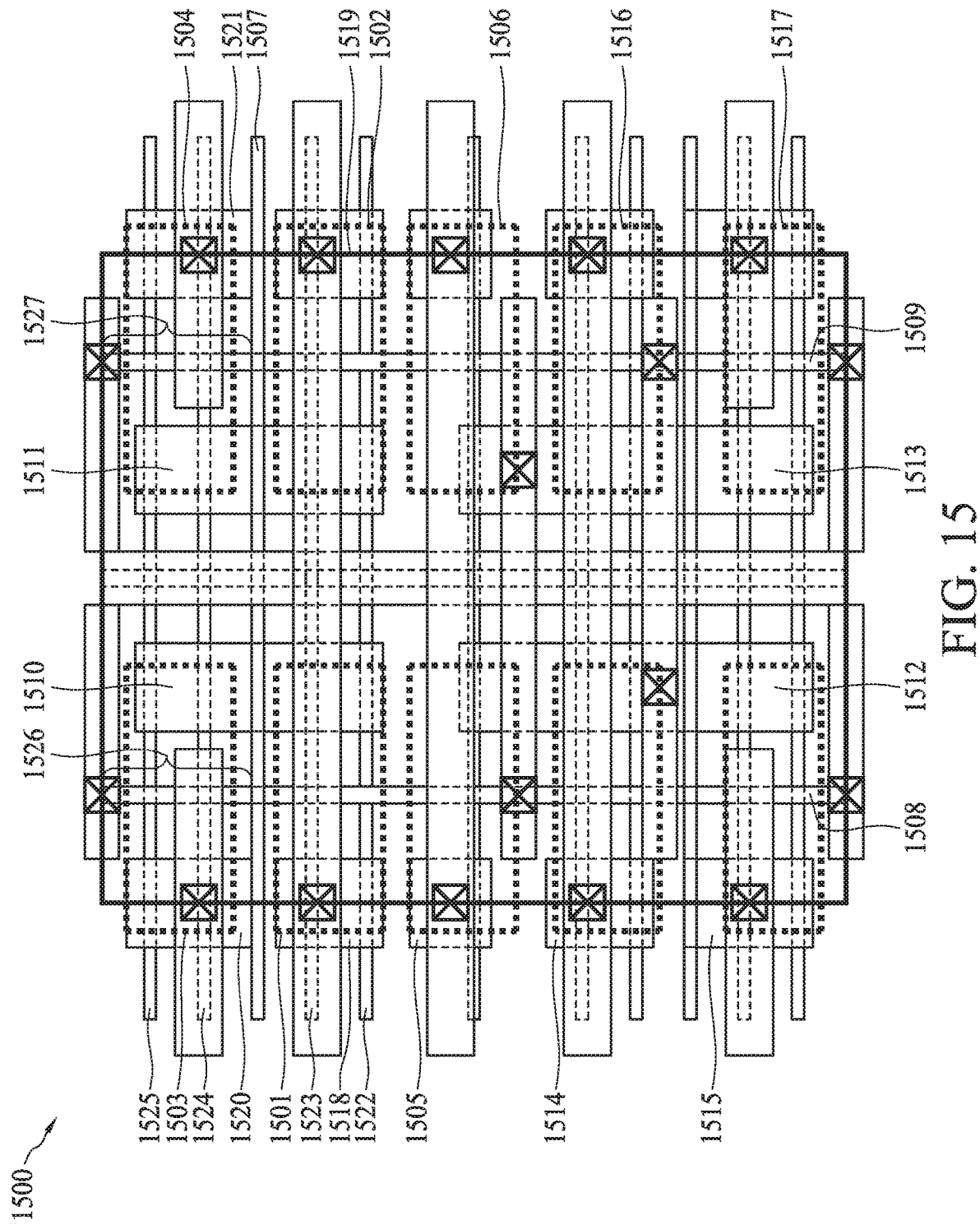
FIG. 15 is a diagram illustrating a layout design of an SRAM cell of FIG. 14 in accordance with some embodiments.

FIG. 15 is a diagram illustrating a layout design 1500 of the SRAM cell 1400 in accordance with some embodiments. For brevity, FIG. 14 merely illustrates the layout design of oxide diffusion layer, polysilicon layer, and metal contact layer on a substrate layout of the SRAM cell 1400. In comparison to the layout design 600, the layout design 1300 further comprises two pull-down transistors 1501, 1502 (i.e. RPD0 and RPD1 in FIG. 14) and two pass-gate transistors 1503, 1504 (i.e. RPG0 and RPG1 in FIG. 14). The two pull-down transistors 1501, 1502 are disposed adjacent to two pull-up transistors 1505 and 1506 (i.e. PU0 and PU1 in FIG. 14) respectively. A cut-poly layout 1507 is disposed on the interface between the two pull-down transistors 1501, 1502 and the two pass-gate transistors 1503, 1504. The cut-poly layout 1507 is disposed across the polysilicon layouts 1508 and 1509 for dividing the polysilicon layouts 1508 and 1509 in the pull-down transistors 1501, 1502 and the pass-gate transistors 1503, 1504. In this embodiment, the substrate layout further comprises four oxide diffusion areas (for example) 1522, 1523, 1524, and 1525, and the polysilicon layouts 1508 and 1509 further extend across the oxide diffusion areas 1522, 1523, 1524, and 1525. The cut-poly layout 1507 is arranged for dividing the polysilicon layouts 1508 and 1509 to generate polysilicon portions 1526 and 1527 respectively. The pull-down transistor 1501 is formed on the oxide diffusion areas 1522 and 1523 and the polysilicon layout 1508. The pull-down transistor 1502 is formed on the oxide diffusion areas 1522 and 1523 and the polysilicon layout 1509. The pass-gate transistor 1503 is formed on the oxide diffusion areas 1524 and 1525 and the polysilicon portion 1526. The pass-gate transistor 1504 is formed on the oxide diffusion areas 1524 and 1525 and the polysilicon portion 1527. A contact layout 1510 is arranged to dispose on a portion of the oxide diffusion areas 1522 and 1523 on the right side of the polysilicon layout 1508 and a portion of the oxide diffusion areas 1524 and 1525 on the right side of the polysilicon portion 1526. A contact layout 1518 is disposed on a portion of the oxide diffusion areas 1522 and 1523 on the left side of the polysilicon layout 1508. A contact layout 1520 is disposed on a portion of the oxide diffusion areas 1524 and 1525 on the left side of the polysilicon portion 1526. A contact layout 1511 is arranged to dispose on a portion of the oxide diffusion areas 1522 and 1523 on the left side of the polysilicon layout 1509 and a portion of the oxide diffusion areas 1524 and 1525 on the left side of the polysilicon portion 1527. A contact layout 1519 is disposed on a portion of the oxide diffusion areas 1522 and 1523 on the right side of the polysilicon layout 1509. A contact layout 1521 is disposed on a portion of the oxide diffusion areas 1524 and 1525 on the right side of the polysilicon portion 1527.

The contact layout 1510 in the pull-down transistor 1501 and the pass-gate transistor 1503 is disconnected from the contact layout 1512 in the pull-up transistor 1505, the pull-down transistor 1514, and the pass-gate transistor 1515. The contact layout 1511 in the pull-down transistor 1502 and the pass-gate transistor 1504 is disconnected from the contact layout 1513 in the pull-up transistor 1506, the pull-down transistor 1516, and the pass-gate transistor 1517. The layout designs of the pull-down transistors 1501 and 1502 are similar to the pull-down transistors 610 and 613 respectively, and the layout designs of the pass-gate transistors 1503 and 1504 are similar to the pass-gate transistors 611 and 614 respectively, thus the detailed description is omitted here for brevity.

Figure 16:
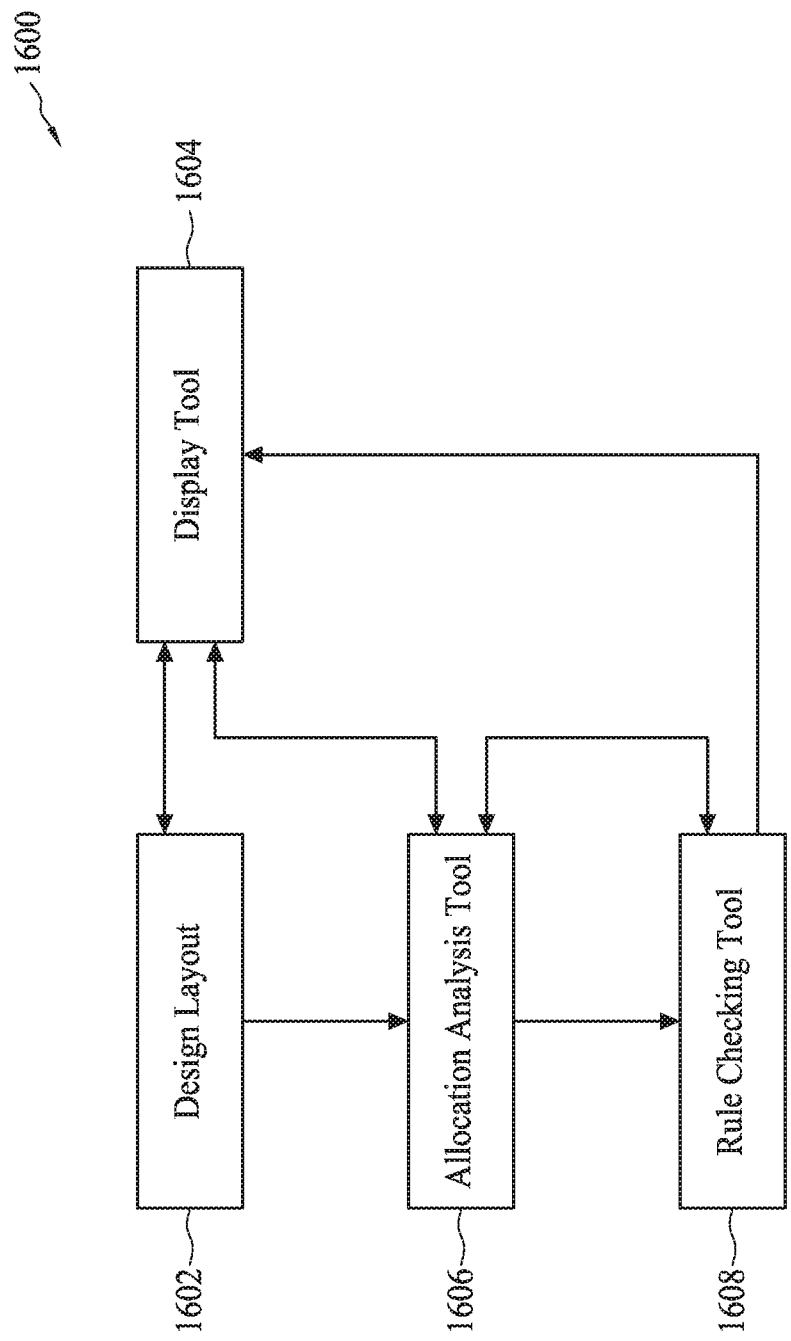
FIG. 16 is a flow chart of a design flow of an integrated circuit chip in accordance with some embodiments.

FIG. 16 is a flow chart of a design flow 1600 of an integrated circuit (IC) chip, e.g. an SRAM circuit, in accordance with some embodiments. The design flow 1600 utilizes one or more electronic design automation (EDA) tools to carry out one or more operations in the design flow 1600.

At an IC design stage 1602, a high-level design of the IC chip is provided by a circuit designer. In some embodiments, a gate-level netlist is generated through logic synthesis based on the high-level design, and gates in the gate-level netlist are mapped to available cells in a standard cell library. The term "netlist" used herein refers to both a graphical-based representation, such as a schematic, and/or a text-based representation of a circuit.

At a floor planning stage 1604, the gate-level netlist is partitioned into functional blocks and a floorplan for the functional blocks in a design layout of the IC chip is created.

At a power planning stage 1606, power meshes such as a VDD power (e.g. the supply voltage) mesh and a VSS power (e.g. the ground voltage) mesh are routed. The power mesh includes several metal layers. Each metal layer includes power lines or power rails running, for example, horizontally or vertically. The metal layers are stacked such that any adjacent metal layers will have the power lines or power rails running in, for example, orthogonal directions.

At a placement stage 1608, mapped cells of logic gates and registers in the blocks are placed at specific locations in the design layout.

At a parasitic extraction and analysis stage 1610, the design layout, which includes the routing, is analyzed to extract the parasitic in the design layout and accordingly generate a physical netlist.

At a physical verification and signoff stage 1612, a layout-versus-schematic (LVS) is performed on a physical netlist generated from the design layout in order to ensure correspondence of the design layout to the gate-level netlist. Further, a design rule check (DRC) is performed on the design layout in order to ensure the design is cleared of, for example, electrical issues and lithographic issues for manufacturing. Incremental fixing can be performed to achieve a final signoff of the IC chip design before tape-out.

Figure 17:
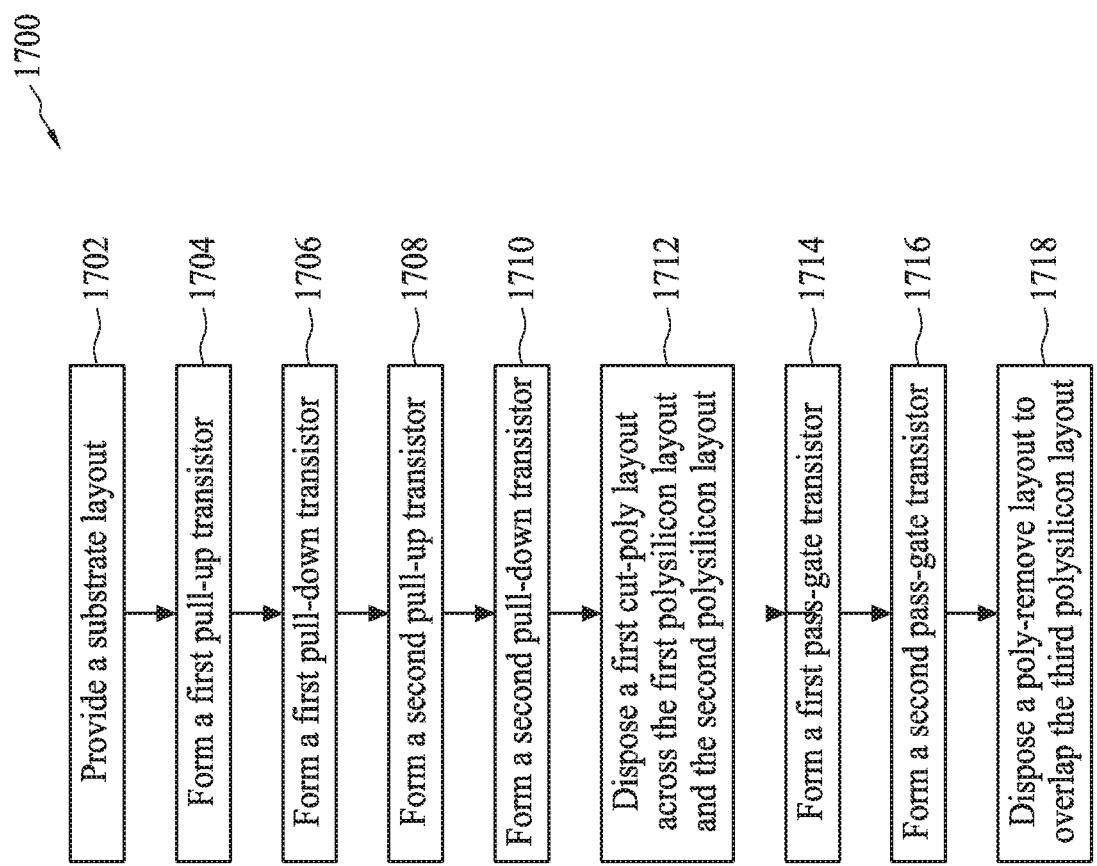
FIG. 17 is a flow diagram illustrating a method of providing a layout design of an SRAM cell in accordance with some embodiments.

FIG. 17 is a flow diagram illustrating a method 1700 of providing a layout design of an SRAM cell in accordance with some embodiments. The method 1700 may be applied to the above-mentioned layout designs, e.g. the layout designs 200, 300, 500, 600, 700, 800, 900, 1200, 1300, or 1500. In some embodiments, the layout modification method 1700 may be performed in the floor planning stage 1604, the power planning stage 1606, and/or the placement stage 1608 of the design flow 1600 described and illustrated in FIG. 16.

Referring to FIG. 17, in operation 1702, a substrate layout is provided. The substrate layout comprises a first oxide diffusion area, a second oxide diffusion area, a third oxide diffusion area, a first polysilicon layout, a second polysilicon layout, and a third polysilicon layout. The first oxide diffusion area, the second oxide diffusion area, and the third oxide diffusion area are three parallel oxide diffusion areas. The first polysilicon layout, the second polysilicon layout, and the third polysilicon layout are three parallel polysilicon layouts. The first polysilicon layout, the second polysilicon layout, and the third polysilicon layout are arranged to extend perpendicularly across the first oxide diffusion area, the second oxide diffusion area, and the third oxide diffusion area.

In operation 1704, a first pull-up transistor is formed on an area around the intersection of the first oxide diffusion area and the first polysilicon layout.

In operation 1706, a first pull-down transistor is formed on an area around the intersection of the second oxide diffusion area and the first polysilicon layout.

In operation 1708, a second pull-up transistor is formed on an area around the intersection of the first oxide diffusion area and the second polysilicon layout.

In operation 1710, a second pull-down transistor is formed on an area around the intersection of the second oxide diffusion area and the second polysilicon layout.

In operation 1712, a first cut-poly layout is disposed across the first polysilicon layout and the second polysilicon layout for dividing the first polysilicon layout into a first polysilicon portion and a second polysilicon portion and dividing the second polysilicon layout into a third polysilicon portion and a fourth polysilicon portion.

In operation 1714, a first pass-gate transistor is formed on an area around the intersection of the third oxide diffusion area and the second polysilicon portion.

In operation 1716, a second pass-gate transistor is formed on an area around the intersection of the third oxide diffusion area and the fourth polysilicon portion.

In operation 1718, a poly-remove layout is disposed to overlap the third polysilicon layout for removing the third polysilicon layout.

For the embodiment of the layout design 1200, the substrate layout further comprises a fourth oxide diffusion area, and the first polysilicon layout and the second polysilicon layout further extend across the fourth oxide diffusion area, and the method 1700 further comprises an operation of disposing a second cut-poly layout across the first polysilicon layout and the second polysilicon layout for dividing the first polysilicon layout and the second polysilicon layout to generate a fifth polysilicon portion and a sixth polysilicon portion respectively. A third pass-gate transistor is formed on an area around the intersection of the fourth oxide diffusion area and the fifth polysilicon portion, and a fourth pass-gate transistor is formed on an area around the fourth oxide diffusion area and the sixth polysilicon portion.

For the embodiment of the layout designs 1300 and 1500, the substrate layout further comprises a fourth oxide diffusion area and a fifth diffusion area, and the first polysilicon layout and the second polysilicon layout further extend across the fourth oxide diffusion area and the fifth diffusion area. The method 1700 further comprises an operation of forming a third pull-down transistor on the fourth oxide diffusion area and the first polysilicon layout, forming a fourth pull-down transistor on the fourth oxide diffusion area and the second polysilicon layout, disposing a second cut-poly layout across the first polysilicon layout and the second polysilicon layout for dividing the first polysilicon layout and the second polysilicon layout to generate a fifth polysilicon portion and a sixth polysilicon portion respectively, forming a third pass-gate transistor on the fifth oxide diffusion area and the fifth polysilicon portion; and forming a fourth pass-gate transistor on the fifth oxide diffusion area and the sixth polysilicon portion.

FIG. 18 is a block diagram of a hardware system 1800 for implementing the method 1700 of providing a layout design of an SRAM cell described with reference to FIG. 17 and the design flow 1600 described with reference to FIG. 16, in accordance with some embodiments. The system 1800 includes at least one processor 1802, a network interface 1804, an input and output (I/O) device 1806, a storage 1808, a memory 1812, and a bus 1810. The bus 1810 couples the network interface 1804, the I/O device 1806, the storage 1808 and the memory 1812 to the processor 1802.

In some embodiments, the memory 1812 comprises a random access memory (RAM) and/or other volatile storage device and/or read only memory (ROM) and/or other non-volatile storage device. The memory 1812 includes user space 1814 and a kernel 1816, configured to store program instructions to be executed by the processor 1802 and data accessed by the program instructions.

In some embodiments, the network interface 1804 is configured to access program instructions and data accessed by the program instructions stored remotely through a network. The I/O device 806 includes an input device and an output device configured for enabling user interaction with the system 1800. The input device comprises, for example, a keyboard, a mouse, etc. The output device comprises, for example, a display, a printer, etc. The storage device 1808 is configured for storing program instructions and data accessed by the program instructions. The storage device 1808 comprises, for example, a magnetic disk and an optical disk.

In some embodiments, for executing the program instructions, the processor 1802 is configured to perform method embodiments described with reference to FIG. 17 and software system embodiments described with reference to FIG. 16.

In some embodiments, the program instructions are stored in a non-transitory computer readable recording medium such as one or more optical disks, hard disks and non-volatile memory devices.

Briefly, according to the above embodiments, the oxide diffusion areas, the polysilicon layouts, the poly-remove layouts, and the cut-poly layouts are continuous layout in a layout design of an SRAM cell. When the layouts of the oxide diffusion areas, the polysilicon layouts, the poly-remove layouts, and the cut-poly layouts are continuous, the complexity of the corresponding masks for fabricating the SRAM circuit is reduced. Accordingly, the cost of fabricating the SRAM circuit is also reduced. Moreover, due to the mirror-symmetric arrangement of the pull-up transistors, the pull-down transistors, and the pass-gate transistors, the size ratio of the pull-up transistors over the pull-down transistors, the size ratio of the pull-down transistors over the pass-gate transistors, and the size ratio of the pull-up transistors over the pass-gate transistors can be controlled by adjusting the number of the oxide diffusion areas.

According to some embodiments, a method of providing a layout design of an SRAM cell is provided. The method comprises: providing a substrate layout comprising a first oxide diffusion area, a second oxide diffusion area, a first polysilicon layout, and a second polysilicon layout, wherein the first oxide diffusion area is parallel to the second oxide diffusion area, the first polysilicon layout is parallel to the second polysilicon layout, the first polysilicon layout extends across the first oxide diffusion area and the second oxide diffusion area, and the second polysilicon layout extends across the first oxide diffusion area and the second oxide diffusion area; forming a first pull-up transistor on the first oxide diffusion area and the first polysilicon layout; forming a first pull-down transistor on the second oxide diffusion area and the first polysilicon layout; forming a second pull-up transistor on the first oxide diffusion area and the second polysilicon layout; and forming a second pull-down transistor on the second oxide diffusion area and second first polysilicon layout.

According to some embodiments, a method of providing a layout design of an SRAM cell is provided. The method comprises: providing a substrate layout comprising a first oxide diffusion area, a second oxide diffusion area, and a first polysilicon layout, wherein the first polysilicon layout extends across the first oxide diffusion area and the second oxide diffusion area; forming a first pull-up transistor on a first portion of the first oxide diffusion area located on a first side of the first polysilicon layout; forming a first pull-down transistor on a first portion of the second oxide diffusion area located on a first side of the first polysilicon layout; forming a second pull-up transistor on a second portion of the first oxide diffusion area located on a second side of the first polysilicon layout; forming a second pull-down transistor on a second portion of the second oxide diffusion area located on a second side of the first polysilicon layout; and disposing a poly-remove layout to overlap the first polysilicon layout to remove the first polysilicon layout.

According to some embodiments, a non-transitory computer-readable storage medium storing program instructions that when executed by a computer cause the computer to perform a method of providing a layout design of an SRAM cell is provided. The method comprises: providing a substrate layout, by at least one processor, comprising a first oxide diffusion area, a second oxide diffusion area, a first polysilicon layout, and a second polysilicon layout, wherein the first oxide diffusion area is parallel to the second oxide diffusion area, the first polysilicon layout is parallel to the second polysilicon layout, the first polysilicon layout extends across the first oxide diffusion area and the second oxide diffusion area, and the second polysilicon layout extends across the first oxide diffusion area and the second oxide diffusion area; forming, by the at least one processor, a first pull-up transistor on the first oxide diffusion area and the first polysilicon layout; forming, by the at least one processor, a first pull-down transistor on the second oxide diffusion area and the first polysilicon layout; forming, by the at least one processor, a second pull-up transistor on the first oxide diffusion area and the second polysilicon layout; and forming, by the at least one processor, a second pull-down transistor on the second oxide diffusion area and second first polysilicon layout.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of providing a layout design of an SRAM cell, comprising:
   providing a substrate layout comprising a first oxide diffusion area, a second oxide diffusion area, a first polysilicon layout, and a second polysilicon layout, wherein the first oxide diffusion area is parallel to the second oxide diffusion area, the first polysilicon layout is parallel to the second polysilicon layout, the first polysilicon layout extends across the first oxide diffusion area and the second oxide diffusion area, and the second polysilicon layout extends across the first oxide diffusion area and the second oxide diffusion area;
   forming a first pull-up transistor on the first oxide diffusion area and the first polysilicon layout;
   forming a first pull-down transistor on the second oxide diffusion area and the first polysilicon layout;
   forming a second pull-up transistor on the first oxide diffusion area and the second polysilicon layout; and
   forming a second pull-down transistor on the second oxide diffusion area and the second polysilicon layout;
   wherein forming the first pull-up transistor on the first oxide diffusion area and the first polysilicon layout comprises:
   disposing a first contact layout to overlap a first portion of the first oxide diffusion area; and
   disposing a second contact layout to overlap a second portion of the first oxide diffusion area; and
   forming the first pull-down transistor on the second oxide diffusion area and the first polysilicon layout comprises:
   arranging the first contact layout to overlap a first portion of the second oxide diffusion area; and
   disposing a third contact layout on a second portion of the second oxide diffusion area.

2. The method of claim 1,
   wherein forming the second pull-up transistor on the first oxide diffusion area and the second polysilicon layout comprises:
   disposing a fourth contact layout to overlap a third portion of the first oxide diffusion area; and
   disposing a fifth contact layout to overlap a fourth portion of the first oxide diffusion area; and
   forming the second pull-down transistor on the second oxide diffusion area and the second polysilicon layout comprises:
   arranging the fourth contact layout to overlap a third portion of the second oxide diffusion area; and
   disposing a sixth contact layout on a fourth portion of the second oxide diffusion area.

3. The method of claim 2, wherein the substrate layout further comprises a third oxide diffusion area, and the first polysilicon layout and the second polysilicon layout further extend across the third oxide diffusion area, and the method further comprises:
   disposing a first cut-poly layout across the first polysilicon layout and the second polysilicon layout for dividing the first polysilicon layout into a first polysilicon portion and a second polysilicon portion and for dividing the second polysilicon layout into a third polysilicon portion and a fourth polysilicon portion, wherein the first polysilicon portion extends across the first oxide diffusion area and the second oxide diffusion area, the second polysilicon portion extends across the third oxide diffusion area, the third polysilicon portion extends across the first oxide diffusion area and the second oxide diffusion area, and the fourth polysilicon portion extends across the third oxide diffusion area;
   forming a first pass-gate transistor on the third oxide diffusion area and the second polysilicon portion; and
   forming a second pass-gate transistor on the third oxide diffusion area and the fourth polysilicon portion.

4. The method of claim 3, wherein forming the first pass-gate transistor on the third oxide diffusion area and the second polysilicon portion comprises:
   arranging the first contact layout to overlap a first portion of the third oxide diffusion area; and
   disposing a seventh contact layout on a second portion of the third oxide diffusion area;
   wherein forming the second pass-gate transistor on the third oxide diffusion area and the fourth polysilicon portion comprises:
   arranging the fourth contact layout to overlap a third portion of the third oxide diffusion area; and
   disposing an eighth contact layout on a fourth portion of the third oxide diffusion area.

5. The method of claim 4, further comprising:
   disposing a first via layout on the first polysilicon portion;
   disposing a second via layout on the fourth contact layout;
   disposing a first metal layout to connect the first via layout and the second via layout;
   disposing a third via layout on the first contact layout;
   disposing a fourth via layout on the third polysilicon portion;
   disposing a second metal layout to connect the third via layout and the fourth via layout;
   disposing a fifth via layout on the second contact layout;
   disposing a sixth via layout on the fifth contact layout;
   disposing a third metal layout to connect the fifth via layout and the sixth via layout;
   disposing a seventh via layout on the third contact layout;
   disposing an eighth via layout on the sixth contact layout;
   disposing a fourth metal layout to connect the seventh via layout and the eighth via layout;
   disposing a ninth via layout on the second polysilicon portion;
   disposing a tenth via layout on the fourth polysilicon portion; and
   disposing a fifth metal layout to connect the ninth via layout and the tenth via layout.

6. The method of claim 3, wherein the substrate layout further comprises a third polysilicon layout extending across the first oxide diffusion area, the second oxide diffusion area, and the third oxide diffusion area, and the method further comprises:
   disposing a poly-remove layout to overlap the third polysilicon layout to cover the third polysilicon layout.

7. The method of claim 3, wherein the substrate layout further comprises a fourth oxide diffusion area, and the first polysilicon layout and the second polysilicon layout further extend across the fourth oxide diffusion area, and the method further comprises:
   disposing a second cut-poly layout across the first polysilicon layout and the second polysilicon layout for dividing the first polysilicon layout and the second polysilicon layout to generate a fifth polysilicon portion and a sixth polysilicon portion respectively, wherein the fifth polysilicon portion and the sixth polysilicon portion extend across the fourth oxide diffusion area;

forming a third pass-gate transistor on the fourth oxide diffusion area and the fifth polysilicon portion; and forming a fourth pass-gate transistor on the fourth oxide diffusion area and the sixth polysilicon portion.

8. The method of claim 7, wherein forming the third pass-gate transistor on the fourth oxide diffusion area and the fifth polysilicon portion comprises:

arranging the first contact layout to overlap a first portion of the fourth oxide diffusion area; and disposing a seventh contact layout on a second portion of the fourth oxide diffusion area;

wherein forming the fourth pass-gate transistor on the fourth oxide diffusion area and the sixth polysilicon portion comprises:

arranging the fourth contact layout to overlap a third portion of the fourth oxide diffusion area; and disposing an eighth contact layout on a fourth portion of the fourth oxide diffusion area.

9. The method of claim 3, wherein the substrate layout further comprises a fourth oxide diffusion area and a fifth diffusion area, and the first polysilicon layout and the second polysilicon layout further extend across the fourth oxide diffusion area and the fifth diffusion area, and the method further comprises:

forming a third pull-down transistor on the fourth oxide diffusion area and the first polysilicon layout;

forming a fourth pull-down transistor on the fourth oxide diffusion area and the second polysilicon layout;

disposing a second cut-poly layout across the first polysilicon layout and the second polysilicon layout for dividing the first polysilicon layout and the second polysilicon layout to generate a fifth polysilicon portion and a sixth polysilicon portion respectively, wherein the fifth polysilicon portion and the sixth polysilicon portion extend across the fifth oxide diffusion area;

forming a third pass-gate transistor on the fifth oxide diffusion area and the fifth polysilicon portion; and forming a fourth pass-gate transistor on the fifth oxide diffusion area and the sixth polysilicon portion.

10. The method of claim 9, wherein forming the third pull-down transistor on the fourth oxide diffusion area and the first polysilicon layout comprises:

arranging the first contact layout to overlap a first portion of the fourth oxide diffusion area; and disposing a seventh contact layout on a second portion of the fourth oxide diffusion area;

wherein forming the fourth pull-down transistor on the fourth oxide diffusion area and the second polysilicon layout comprises:

arranging the fourth contact layout to overlap a third portion of the fourth oxide diffusion area; and disposing an eighth contact layout on a fourth portion of the fourth oxide diffusion area.

11. The method of claim 10, wherein forming the third pass-gate transistor on the fifth oxide diffusion area and the fifth polysilicon portion comprises:

arranging the first contact layout to overlap a first portion of the fifth oxide diffusion area; and disposing a ninth contact layout on a second portion of the fifth oxide diffusion area;

wherein forming the fourth pass-gate transistor on the fifth oxide diffusion area and the sixth polysilicon portion comprises:

arranging the fourth contact layout to overlap a third portion of the fifth oxide diffusion area; and disposing a tenth contact layout on a fourth portion of the fifth oxide diffusion area.

12. The method of claim 9, wherein forming the third pull-down transistor on the fourth oxide diffusion area and the first polysilicon layout comprises:

disposing a seventh contact layout to overlap a first portion of the fourth oxide diffusion area; and disposing an eighth contact layout on a second portion of the fourth oxide diffusion area;

wherein forming the fourth pull-down transistor on the fourth oxide diffusion area and the second polysilicon layout comprises:

arranging a ninth contact layout to overlap a third portion of the fourth oxide diffusion area; and disposing a tenth contact layout on a fourth portion of the fourth oxide diffusion area.

13. The method of claim 12, wherein forming the third pass-gate transistor on the fifth oxide diffusion area and the fifth polysilicon portion comprises:

arranging the seventh contact layout to overlap a first portion of the fifth oxide diffusion area; and disposing an eleventh contact layout on a second portion of the fifth oxide diffusion area;

wherein forming the fourth pass-gate transistor on the fifth oxide diffusion area and the sixth polysilicon portion comprises:

arranging the ninth contact layout to overlap a third portion of the fifth oxide diffusion area; and disposing a twelfth contact layout on a fourth portion of the fourth oxide diffusion area.

14. A method of providing a layout design of an SRAM cell, comprising:

providing a substrate layout comprising a first oxide diffusion area, a second oxide diffusion area, and a first polysilicon layout, wherein the first polysilicon layout extends across the first oxide diffusion area and the second oxide diffusion area;

forming a first pull-up transistor on a first portion of the first oxide diffusion area located on a first side of the first polysilicon layout;

forming a first pull-down transistor on a first portion of the second oxide diffusion area located on the first side of the first polysilicon layout;

forming a second pull-up transistor on a second portion of the first oxide diffusion area located on a second side of the first polysilicon layout;

forming a second pull-down transistor on a second portion of the second oxide diffusion area located on the second side of the first polysilicon layout; and disposing a poly-remove layout to overlap the first polysilicon layout to cover the first polysilicon layout;

wherein the substrate layout further comprises a third oxide diffusion area, the first polysilicon layout and the poly-remove layout further extend across the third oxide diffusion area, and the method further comprises:

forming a first pass-gate transistor on a first portion of the third oxide diffusion area located on the first side of the first polysilicon layout; and forming a second pass-gate transistor on a second portion of the third oxide diffusion area located on the second side of the first polysilicon layout.

15. The method of claim 14, wherein the substrate layout further comprises a fourth oxide diffusion area, and the first polysilicon layout and the poly-remove layout further extend across the fourth oxide diffusion area, and the method further comprises:
  forming a third pass-gate transistor on a first portion of the fourth oxide diffusion area located on the first side of the first polysilicon layout; and
  forming a fourth pass-gate transistor on a second portion of the fourth oxide diffusion area located on the second side of the first polysilicon layout.

16. The method of claim 14, wherein the substrate layout further comprises a fourth oxide diffusion area and a fifth diffusion area, and the first polysilicon layout and the poly-remove layout further extend across the fourth oxide diffusion area and the fifth diffusion area, and the method further comprises:
  forming a third pull-down transistor on a first portion of the fourth oxide diffusion area located on the first side of the first polysilicon layout;
  forming a fourth pull-down transistor on a second portion of the fourth oxide diffusion area located on the second side of the first polysilicon layout;
  forming a third pass-gate transistor on a first portion of the fifth oxide diffusion area located on the first side of the first polysilicon layout; and
  forming a fourth pass-gate transistor on a second portion of the fifth oxide diffusion area located on the second side of the first polysilicon layout.

17. A method of providing a layout design of an SRAM cell, comprising:
  providing a substrate layout comprising a first oxide diffusion area, a second oxide diffusion area, a first polysilicon layout, and a second polysilicon layout, wherein the first oxide diffusion area is parallel to the second oxide diffusion area, the first polysilicon layout is parallel to the second polysilicon layout, the first polysilicon layout extends across the first oxide diffusion area and the second oxide diffusion area, and the second polysilicon layout extends across the first oxide diffusion area and the second oxide diffusion area;
  forming a first transistor of a first inverter on the first oxide diffusion area and the first polysilicon layout;
  forming a first transistor of a second inverter on the first oxide diffusion area and the second polysilicon layout, wherein an input of the first inverter is coupled to an output of the second inverter, and an output of the first inverter is coupled to an input of the second inverter;
  disposing a cut-poly layout across the first polysilicon layout and the second polysilicon layout for dividing the first polysilicon layout into a first polysilicon portion and a second polysilicon portion and for dividing the second polysilicon layout into a third polysilicon portion and a fourth polysilicon portion, wherein the first polysilicon portion extends across the first oxide diffusion area, the second polysilicon portion extends across the second oxide diffusion area, the third polysilicon portion extends across the first oxide diffusion area, and the fourth polysilicon portion extends across the second oxide diffusion area;
  forming a first pass-gate transistor on the second oxide diffusion area and the second polysilicon portion; and
  forming a second pass-gate transistor on the second oxide diffusion area and the fourth polysilicon portion.

18. The method of claim 17, wherein each of the first transistor of the first inverter and the first transistor of the second inverter is a pull-up transistor.

19. The method of claim 17, wherein each of the first transistor of the first inverter and the first transistor of the second inverter is a pull-down transistor.

20. The method of claim 17, wherein the substrate layout further comprises a third oxide diffusion area parallel to the first oxide diffusion area, and each of the first polysilicon portion and the third polysilicon portion extends across the third oxide diffusion area; the method further comprises:
  forming a second transistor of the first inverter on the third oxide diffusion area and the first polysilicon portion; and
  forming a second transistor of the second inverter on the third oxide diffusion area and the third polysilicon portion.

21. The method of claim 20, wherein each of the first transistor of the first inverter and the first transistor of the second inverter is one of a pull-up transistor and a pull-down transistor, and each of the second transistor of the first inverter and the second transistor of the second inverter is the other of the pull-up transistor and the pull-down transistor.

* * * * *